United States Patent
Usami et al.

(10) Patent No.: US 7,649,258 B2
(45) Date of Patent: Jan. 19, 2010

(54) SEMICONDUCTOR DEVICE

(75) Inventors: Tatsuya Usami, Kawasaki (JP); Koichi Ohto, Kawasaki (JP)

(73) Assignee: Nec Electronics Corporation, Kanagawa (JP)

( * ) Notice: Subject to any disclaimer, the term of this patent is extended or adjusted under 35 U.S.C. 154(b) by 134 days.

(21) Appl. No.: 11/197,360

(22) Filed: Aug. 5, 2005

(65) Prior Publication Data

US 2006/0038297 A1  Feb. 23, 2006

(30) Foreign Application Priority Data

Aug. 19, 2004  (JP) .............................. 2004-239578

(51) Int. Cl.
 H01L 23/48 (2006.01)
 H01L 23/52 (2006.01)
 H01L 29/40 (2006.01)
(52) U.S. Cl. .................. 257/758; 257/774; 257/760; 257/775
(58) Field of Classification Search ................. 257/758, 257/510, 523, 774, 637, 759, 775, 760, 210, 257/211, 503, 508
 See application file for complete search history.

(56) References Cited

U.S. PATENT DOCUMENTS

| | | | | |
|---|---|---|---|---|
| 5,181,087 A | * | 1/1993 | Usagawa et al. ............ | 257/194 |
| 5,726,098 A | * | 3/1998 | Tsuboi ........................ | 438/622 |
| 6,355,540 B2 | * | 3/2002 | Wu ............................. | 438/433 |
| 6,602,749 B2 | * | 8/2003 | Tu et al. ...................... | 438/253 |
| 6,624,040 B1 | * | 9/2003 | Ng et al. ..................... | 438/422 |
| 7,053,487 B2 | * | 5/2006 | Saito et al. .................. | 257/750 |
| 7,138,329 B2 | * | 11/2006 | Lur et al. ..................... | 438/619 |
| 7,507,652 B2 | * | 3/2009 | Cho et al. .................... | 438/591 |
| 2002/0158337 A1 | * | 10/2002 | Babich et al. ............... | 257/758 |
| 2003/0183940 A1 | * | 10/2003 | Noguchi et al. ............. | 257/767 |

FOREIGN PATENT DOCUMENTS

| | | |
|---|---|---|
| JP | 8-306771 | 11/1996 |
| JP | 10-172927 | 6/1998 |
| JP | 2000-003917 | 1/2000 |
| JP | 2002-217198 | 8/2002 |
| JP | 2004-079596 | 3/2004 |

OTHER PUBLICATIONS

Japanese Patent Office issued a Japanese Office Action dated Aug. 4, 2009, Application No. 2004-239578.

* cited by examiner

*Primary Examiner*—Chuong A. Luu
(74) *Attorney, Agent, or Firm*—Young & Thompson

(57) ABSTRACT

Propagation of a crack in a semiconductor device is to be suppressed, thus to protect an element forming region. An interface reinforcing film is provided so as to cover a sidewall of a concave portion that penetrates a SiCN film and a SiOC film formed on a silicon substrate. The interface reinforcing film is integrally and continuously formed with another SiOC film, and includes an air gap.

16 Claims, 22 Drawing Sheets

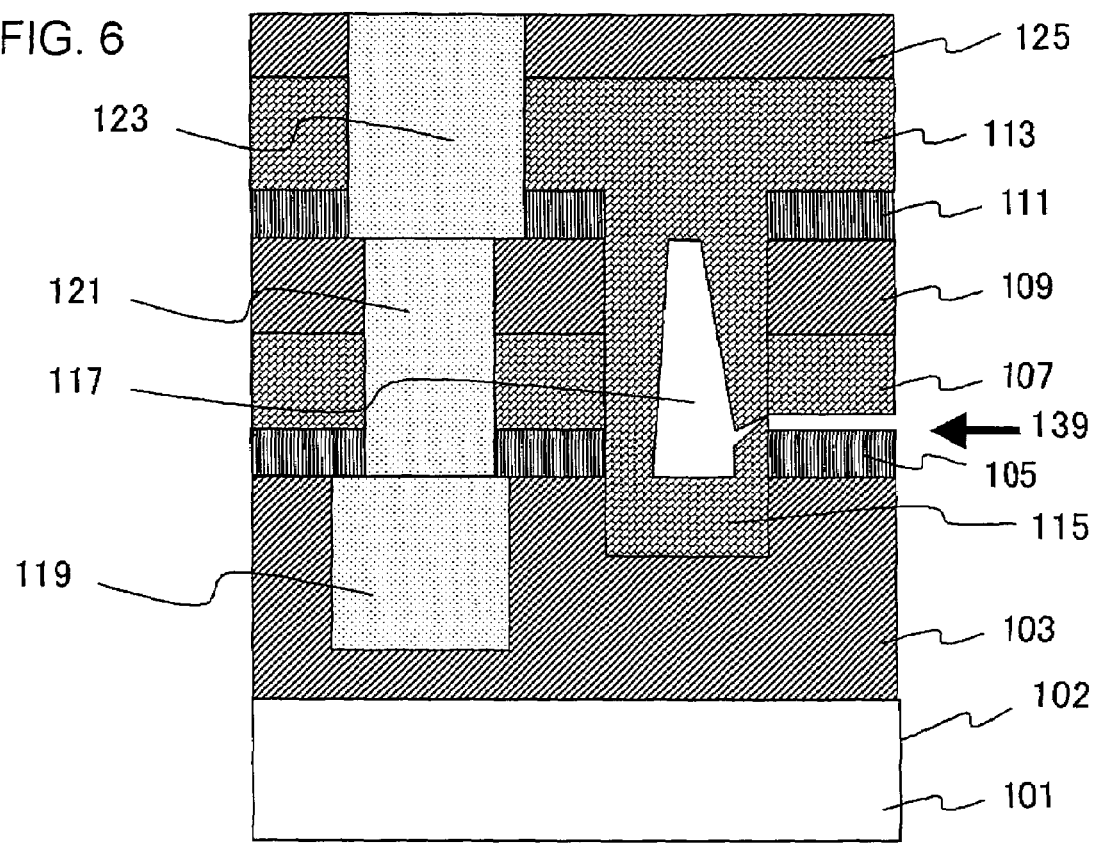

SEMICONDUCTOR DEVICE

This application is based on Japanese patent application No. 2004-239578, the content of which is incorporated hereinto by reference.

BACKGROUND OF THE INVENTION

1. Field of the Invention

The present invention relates to a semiconductor device, and more particularly to a semiconductor device including a multilayer interconnect structure.

2. Description of the Related Art

For manufacturing a semiconductor device including a multilayer interconnect structure formed on a semiconductor substrate, use of a low dielectric constant material, which is referred to as low-k material, has been studied, as an insulating interlayer for reducing a parasitic capacitance between interconnects. The semiconductor devices including the multilayer interconnect structure in which the low dielectric constant film is employed as the insulating interlayer are formed in a plurality of numbers on a wafer, and then split into individual devices by dicing.

At the dicing process, however, a nick is often made on a cut section. Since the nick is where a stress concentrates, a crack is prone to be created from the nick. Accordingly, when the nick is made by dicing close to an interface of stacked insulating films, the crack may propagate along the interface from the cut section to an inner portion of the semiconductor substrate.

Especially in the case where the low dielectric constant film is employed as the insulating interlayer, the propagation of the crack incurs a significant impact. For example, if the low dielectric constant film is exposed on the diced section at the wafer dicing process, the low dielectric constant film may separate from the adjacent layers under a heat cycle of a subsequent temperature cycle test and so on.

Such problem of the crack along the interface is also incidental to a semiconductor device including a circuit with a fuse, in addition to the dicing process, and therefore constitutes an important issue to be addressed.

For suppressing propagation of a crack, JP-A No. H10-172927 proposes forming a slit on a main surface of a semiconductor chip so as to surround a guard ring, in a semiconductor device including a multilayer interconnect structure in which a BPSG (Boron-doped Phosphor Silicate Glass) is employed as part of an insulating interlayer. According to this document, such structure can be considered to effectively inhibit a crack from propagating into an inner portion of the chip.

However, it has now been discovered that the technique according to the cited document requires forming a deep slit on the semiconductor substrate that penetrates a plurality of interconnect layers. Accordingly, as the number of stacks of the interconnect layer increases, the slit has be to formed in a greater aspect ratio, which makes it all the more difficult to perform the etching to form the slit. Therefore, this technique still has a room for improvement, from the viewpoint of the device configuration and simplification of the manufacturing process.

SUMMARY OF THE INVENTION

The present inventors have made a close investigation on the crack that emerges at an interface of stacked films. As a result, it has been discovered that the crack is more prone to be created at an interface of the insulating films, when the insulating films are constituted of different materials. Based on this the present inventors have ardently studied on the remedy to suppress the propagation of the crack along such an interface with a simplified structure, thus to achieve the present invention.

According to the present invention, there is provided a semiconductor device comprising a semiconductor substrate; a first insulating film formed on the semiconductor substrate; a second insulating film formed on the first insulating film; a concave portion penetrating the first insulating film and the second insulating film; and an interface reinforcing film disposed so as to be buried in the concave portion and to be across a side face of the first insulating film to a side face of the second insulating film.

According to the present invention, the interface reinforcing film serves as a crack propagation barrier film that inhibits a crack from propagating along the interface between the first insulating film and the second insulating film. In the semiconductor device thus constructed, the interface reinforcing film is disposed along the sidewall of the concave portion corresponding to the side face of the first insulating film and the second insulating film. Accordingly, even though a crack is created at the interface between the first insulating film and the second insulating film, the propagation of the crack can be suppressed, and thereby separation between the layers at the interface can be suppressed.

The semiconductor device according to the present invention may further comprise a third insulating film formed on the second insulating film, and the interface reinforcing film and the third insulating film may constitute a continuous and integral structure. Such configuration suppresses the crack propagation along the interface between the first insulating film and the second insulating film, with a simple structure. The term of "continuous and integral" herein refers to a continuously formed unified structure. Preferably, the integral and continuous structure is constituted of a single member, without a joint portion.

The semiconductor device according to the present invention may further comprise a multilayer interconnect structure formed on the semiconductor substrate, and including a plurality of interconnect layers and a conductive plug layer connecting interconnects included in the different interconnect layers, and the conductive plug layer may include the first insulating film, the second insulating film and the interface reinforcing film. In this configuration the interface reinforcing film is located in the same layer as the conductive plug. Therefore, a crack created in the conductive plug layer can be securely inhibited from propagating.

The semiconductor device according to the present invention may further comprise an interconnect layer formed on the semiconductor substrate, and the first insulating film may be formed on the interconnect layer and the interface reinforcing film may be disposed along a portion corresponding to the interconnect layer and the second insulating film, of a sidewall of the concave portion penetrating the interconnect layer, the first insulating film and the second insulating film. Such configuration further ensures the suppressing effect against the crack propagation when the crack is created at the interface, thus effectively inhibiting the separation the first insulating film and the second insulating film.

In the semiconductor device according to the present invention, the interface reinforcing film may include an air gap. Intentionally providing an air gap inside the interface reinforcing film further assures the suppressing effect against the crack propagation. According to the present invention, the interface reinforcing film may be constituted of a low dielectric constant film.

In the semiconductor device according to the present invention, the interface reinforcing film may be filled in the concave portion and have a solid structure. Such structure also effectively suppresses the crack propagation along the interface. According to the present invention, the interface reinforcing film may be constituted of a $SiO_2$ film.

In the semiconductor device according to the present invention, the second insulating film may be constituted of a low dielectric constant film. The low dielectric constant film herein means a film having a specific dielectric constant of 3.5 or lower. Such structure suppresses the crack propagation along the interface between the low dielectric constant film and an adjacent insulating film.

In the semiconductor device according to the present invention, the second insulating film may have a lower film density than the first insulating film.

In the semiconductor device according to the present invention, the first insulating film may be constituted of one of a SiC film, a SiCN film, a SiN film and a SiON film, and the second insulating film may be constituted of one selected out of the group consisting of a SiOC film, a hydrogen polysiloxane film, a methyl polysiloxane film, and a methyl hydrogen polysiloxane film.

In the semiconductor device according to the present invention, the concave portion may be formed in a groove shape. Such configuration further ensures the suppressing effect against the crack propagation along the interface between the first insulating film and the second insulating film.

In the semiconductor device according to the present invention, the semiconductor substrate may include a first region in which an element is provided and a second region, and the interface reinforcing film may be disposed along a boundary between the first region and the second region. In this case, the second region is a region that may incur a damage to the semiconductor device. Accordingly, disposing the interface reinforcing film along the boundary between such second region and the first region allows interrupting the propagation of the crack that has been created in the second region, into the first region. Consequently, the element provided in the first region can be prevented from being damaged.

In the semiconductor device according to the present invention, the semiconductor substrate may include a region in which a element is provided and a peripheral region surrounding the periphery of the region in which the element is provided, and the interface reinforcing film may be disposed in the peripheral region. Such configuration suppresses the crack propagation into the region in which the element is provided. Consequently, the element provided in the inner region can be prevented from being damaged.

The semiconductor device according to the present invention may further comprise a guard ring located in the peripheral region so as to surround the region in which the element is provided, and the interface reinforcing film may be disposed so as to surround an outer periphery of the guard ring. Such configuration further enhances the protection of the guard ring, as well as the inner region in which the element is provided.

It is to be noted that any combination of the foregoing features, or any conversion of the descriptions in the present invention into a method or a device is duly included in the scope of the present invention.

To cite a few examples, according to the present invention, the interface reinforcing film may be disposed over an entire sidewall of the concave portion. Such configuration further ensures the suppressing effect against the crack propagation along the interface between the first insulating film and the second insulating film.

Also, according to the present invention, a bottom portion of the air gap may be located closer to the semiconductor substrate than to the interface between the first insulating film and the second insulating film. Such configuration further ensures the suppressing effect against the crack propagation along the interface between the first insulating film and the second insulating film, and thus prevents the separation between these layers.

Further, according to the present invention, the interface reinforcing film may be formed in a stripe pattern. Also, the interface reinforcing film may be formed in an annular shape. Such configuration suppresses the crack propagation from an inner region of the interface reinforcing film toward an outer region, as well as the crack propagation from an outer region of the interface reinforcing film into an inner region.

Further, according to the present invention, the SiOC film may include Si, O, C and H as constituents, and may be deposited by a CVD process.

As described through the preceding passages, according to the present invention, providing the interface reinforcing film so as to be buried in the concave portion penetrating the first insulating film and the second insulating film, and to be across a side face of the first insulating film to a side face of the second insulating film, leads to achieving a technique that can suppress the propagation of the crack in the semiconductor device, and thereby minimize the impact to associated regions.

BRIEF DESCRIPTION OF THE DRAWINGS

The above and other objects, advantages and features of the present invention will be more apparent from the following description taken in conjunction with the accompanying drawings, in which:

FIG. 6 is a schematic cross-sectional view showing a configuration of a semiconductor device according to the first embodiment;

DETAILED DESCRIPTION OF THE INVENTION

The present invention will be now described herein with reference to illustrative embodiments. Those skilled in the art will recognize that many alternative embodiments can be accomplished using the teachings of the present invention and that the invention is not limited to the embodiments illustrated for explanatory purpose.

Referring to the accompanying drawings, embodiments of the present invention will be described hereunder, with respect to a semiconductor device including multilayer interconnects provided in an element forming region as an example. In all the drawings, a constituent employed in common is given an identical numeral, and duplicating description may not be represented where appropriate.

First Embodiment

A first embodiment relates to a semiconductor device including a multilayer interconnect structure in which a low dielectric constant film is employed as an insulating interlayer.

Figure 1:
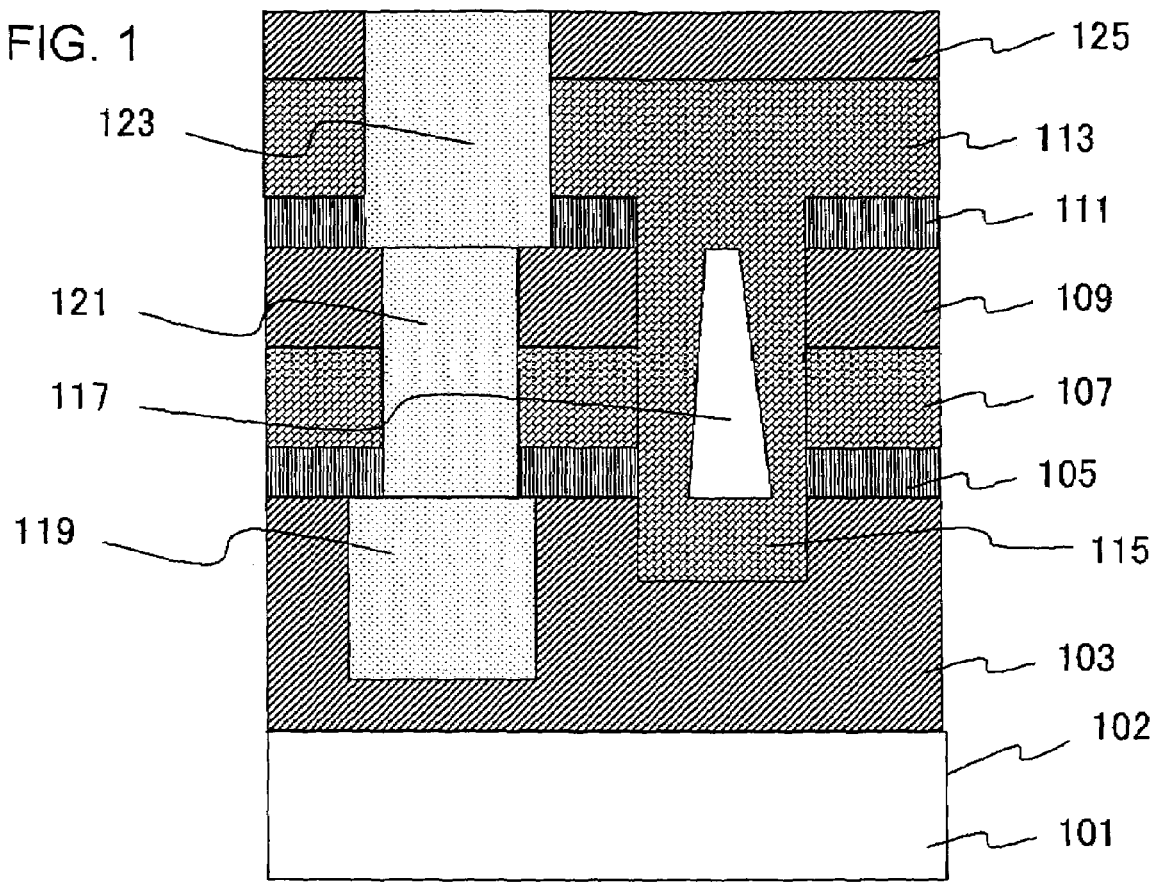
FIG. 1 is a schematic cross-sectional view showing a configuration of a semiconductor device according to an embodiment of the present invention.

FIG. 1 is a schematic cross-sectional view showing a configuration of a semiconductor device according to the present embodiment. Referring to FIG. 1, the semiconductor device 100 includes an insulating interlayer formed on a silicon substrate, and the insulating interlayer includes a multilayer interconnect structure including a copper interconnect and a via. The structure illustrated in FIG. 1 represents a portion of such a multilayer interconnect structure formed through a single damascene process, in which a lower interconnect constituted of a Cu film 119 is connected to an upper interconnect constituted of a Cu film 123 via a Cu plug 121.

The lower interconnect constituted of the Cu film 119 is located inside the insulating film 103. The insulating film 103 is constituted of stacked films including, for example, an underlying insulating film, a SiCN film, a SiOC film and a SiO$_2$ film. A side face and a bottom face of the Cu film 119 are covered with a Ta (lower)/TaN (upper) film (not shown) serving as a barrier metal layer.

An interface reinforcing film 115 is located so as to be buried in a concave portion penetrating a SiCN film 105 and a SiOC film 107 disposed in contact with the SiCN film 105, to be across a side face of the SiCN film 105 to that of the SiOC film 107 and to cover them. According to FIG. 1, the concave portion extends over a region from the insulating film 103 to the SiOC film 107, and the interface reinforcing film 115 covers an entire sidewall of the concave portion.

The interface reinforcing film 115 constitutes a continuous and integral structure with a SiOC film 113. The interface reinforcing film 115 is constituted of SiOC, which is a low dielectric constant material. The interface reinforcing film 115 has a width narrower than a depth thereof, and includes an air gap 117. The air gap 117 is located such that its bottom face is closer to the silicon substrate 101 than to an interface between the SiCN film 105 and the SiOC film 107. In FIG. 1, the bottom face of the air gap 117 is located inside the insulating film 103.

The Cu plug 121 is located in a hole formed through the stacked layers including the SiCN film 105, SiOC film 107 and the SiO$_2$ film 109, on the insulating film 103. A side face and a bottom face of the hole are covered with a Ta/TaN layer (not shown) serving as a barrier metal layer. The Cu plug 121 and the interface reinforcing film 115 are both buried in the SiCN film 105 and the SiOC film 107, all of which are located in the same layer.

The upper interconnect constituted of the Cu film 123 is located in stacked layers including a SiCN film 111, a SiOC film 113 and a SiO$_2$ film 125. A side face and a bottom face of the Cu film 123 are covered with a Ta/TaN layer (not shown) serving as a barrier metal layer.

A manufacturing process of the semiconductor device according to the present embodiment will now be described hereunder. FIGS. 2A, 2B, 3A, 3B, 4A and 4B are schematic cross-sectional views sequentially showing the manufacturing process of the semiconductor device according to the present embodiment.

Figure 2A:
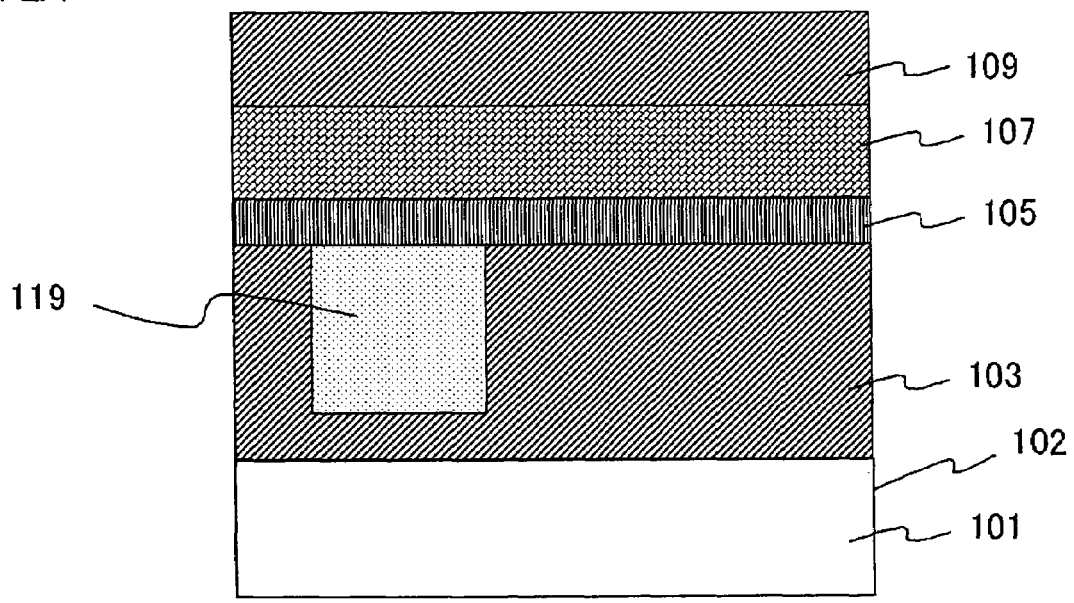
FIGS. 2A and 2B are schematic cross-sectional views for explaining a manufacturing process of the semiconductor device according to the embodiment.

Referring first to FIG. 2A, the insulating film 103 is deposited in a thickness of 500 nm on the silicon substrate 101 on which a semiconductor element (not shown) is provided. Then a dry etching is selectively performed on the insulating film 103 so as to form an interconnect trench. The interconnect trench is filled with the Ta/TaN layer (not shown) and the Cu film 119, to thus form the lower interconnect. After that, the SiCN film 105, SiOC film 107 and the SiO$_2$ film 109 are sequentially formed all over the silicon substrate 101, thereby covering the lower interconnect. Here, the SiCN film 105 serves as an etching stopper for the SiOC film 107, as well as a copper diffusion barrier. Also, the SiO$_2$ film 109 is a cap layer for the SiOC film 107.

Figure 2B:
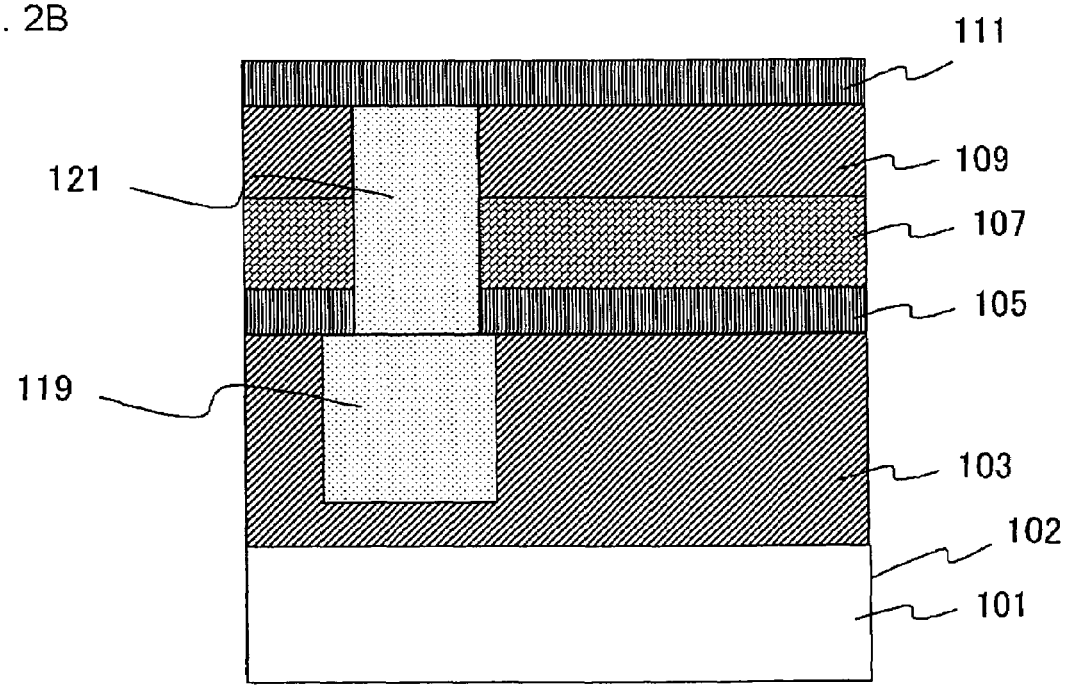

To the SiO$_2$ film 109, an anti-reflection film (not shown) and a photoresist (not shown) are sequentially applied, and a photolithography and selective etching are performed on the SiO$_2$ film 109, the SiOC film 107 and the SiCN film 105 in this order, so as to form a via pattern, followed by an ashing process to remove the photoresist and the anti-reflection film. Then the SiCN film 105 present at the bottom of the via is removed by etchback, and residue of the etching process is removed by a stripper. A sputtering is then performed to deposit a Ta/TaN layer (not shown) in a thickness of 30 nm, on which a copper seed layer (not shown) is formed. Now an electrolytic plating is performed to deposit the Cu film in a thickness of 700 nm so as to fill in the via pattern, thus to form the Cu plug 121. This is followed by a heat treatment at 400 degree centigrade, for crystallization, and then by a CMP (chemical mechanical polishing) process to remove the excess of the Cu film and the Ta/TaN layer on the $SiO_2$ film 109, which completes the formation of the Cu plug 121. Then the SiCN film 111 is deposited in a thickness of 50 nm, which is to serve as a copper diffusion barrier (FIG. 2B).

Figure 3A:
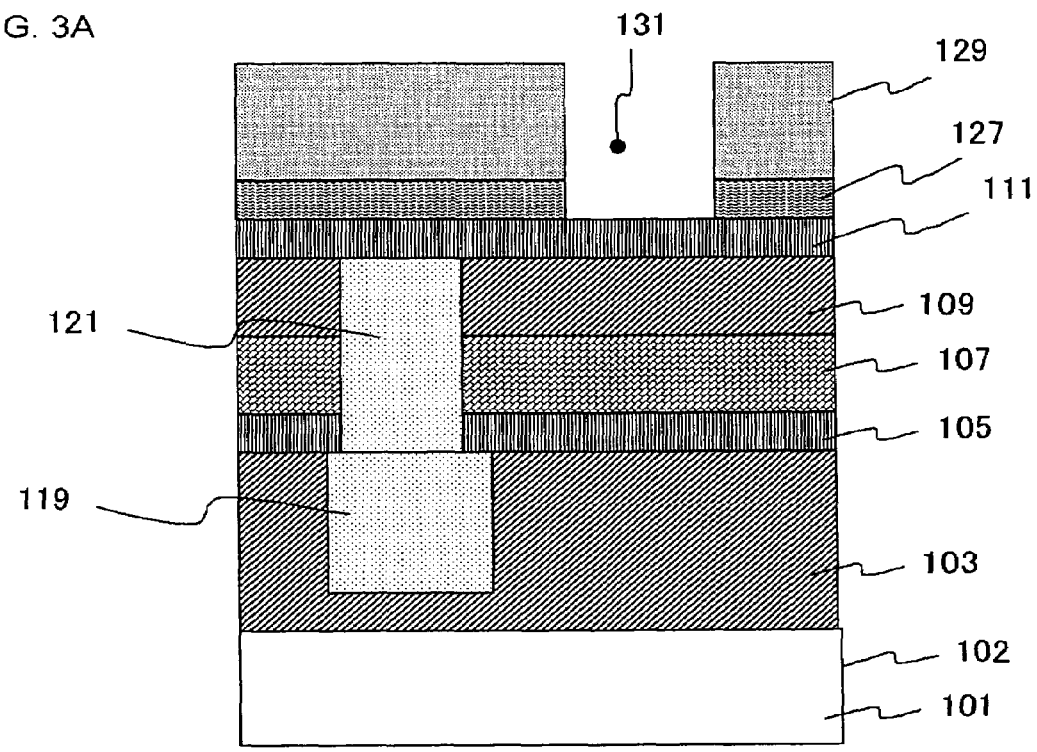
FIGS. 3A and 3B are schematic cross-sectional views for explaining a manufacturing process of the semiconductor device according to the embodiment.

Proceeding to FIG. 3A, an anti-reflection film 127 and a resist film 129 are applied to the SiCN film 111, and an opening 131 is provided on the resist film 129 and the anti-reflection film 127. The opening 131 is located close to a dicing section 102 of the silicon substrate 101. Here, the opening 131 is formed in a groove shape along an entire periphery of the element forming region, so as to surround the region including the Cu film 119, Cu plug 121 and a Cu film 123 to be subsequently formed. The opening 131 may be formed in a width of 300 nm, for example.

Figure 3B:
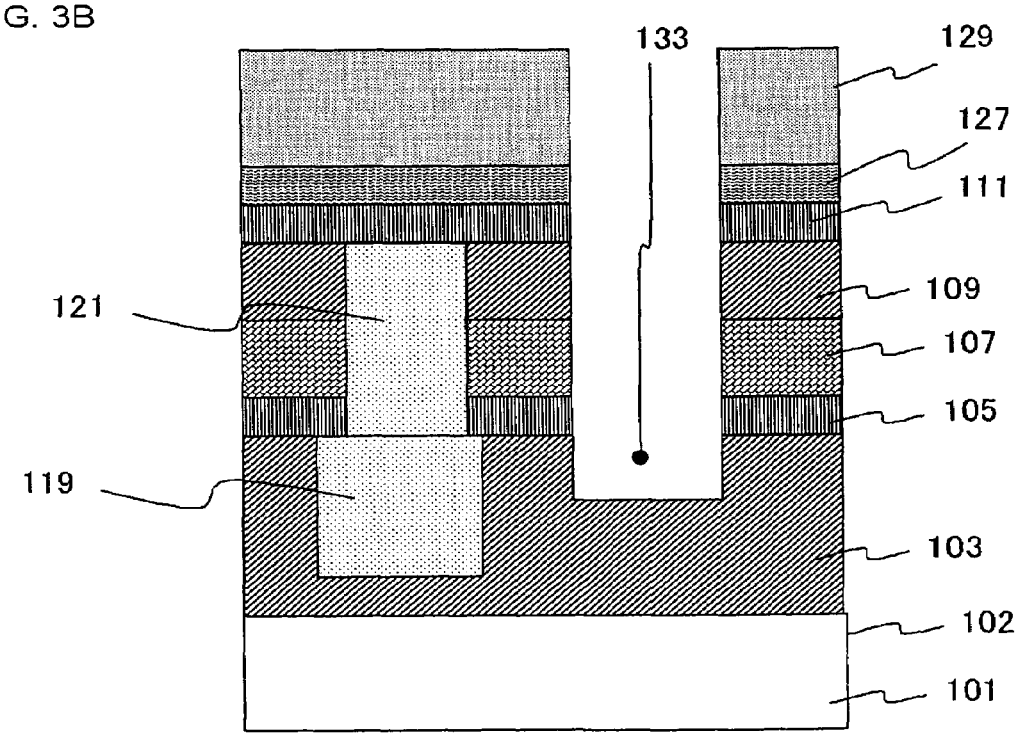

Then an etching process is performed on the SiCN film 111, $SiO_2$ film 109, SiOC film 107, SiCN film 105, and the insulating film 103 based on the photolithography utilizing the resist film 129 as a mask, so as to form a groove-shaped concave portion 133. Here, the etching effect covers the range from the SiCN film 111 to the $SiO_2$ film included in the insulating film 103 (FIG. 3B).

Figure 4A:
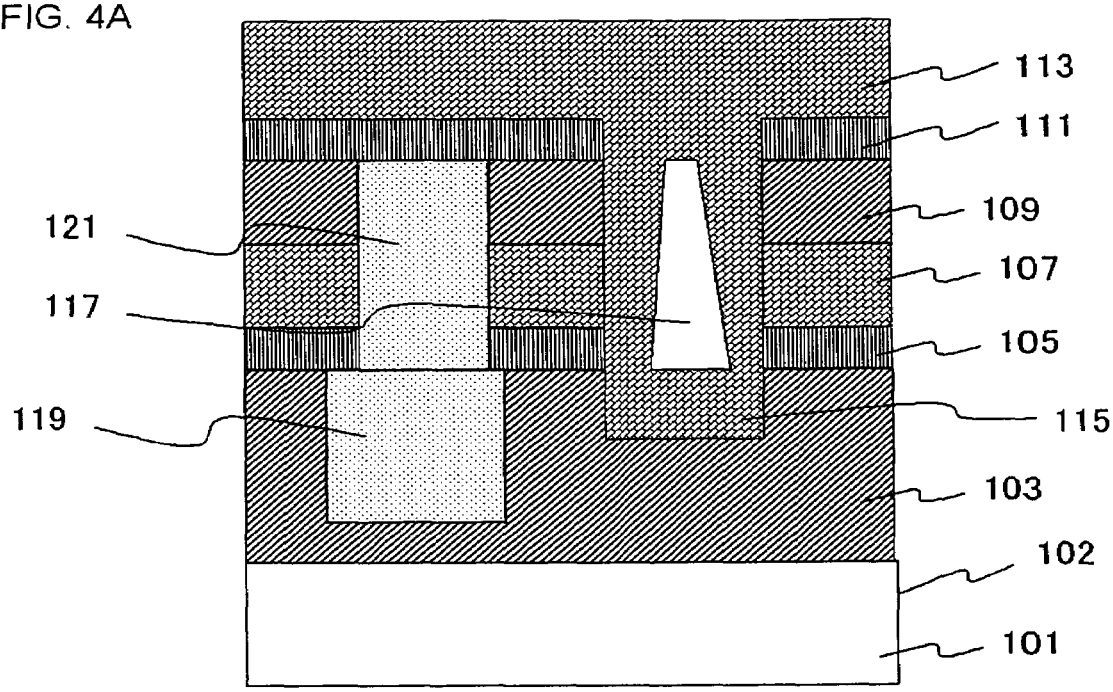
FIGS. 4A and 4B are schematic cross-sectional views for explaining a manufacturing process of the semiconductor device according to the embodiment.

The resist film 129 and the anti-reflection film 127 are then removed. Referring now to FIG. 4A, the SiOC film 113, which is a low dielectric constant film, is deposited on the SiCN film 111 so as to fill the concave portion 133 but leaving the air gap 117, thus to form the interface reinforcing film 115. At this step, the concave portion 133 is formed with a depth greater than a width thereof. This provides a greater aspect ratio to the concave portion 133, and thereby secures a room for disposing the air gap 117. Then the CVD condition for depositing the SiOC film 113 may be set as between 350 and 400 degree centigrade in temperature and 5 and 8 Torr in pressure for example, so as to form the air gap 117 inside the interface reinforcing film 115.

Figure 4B:
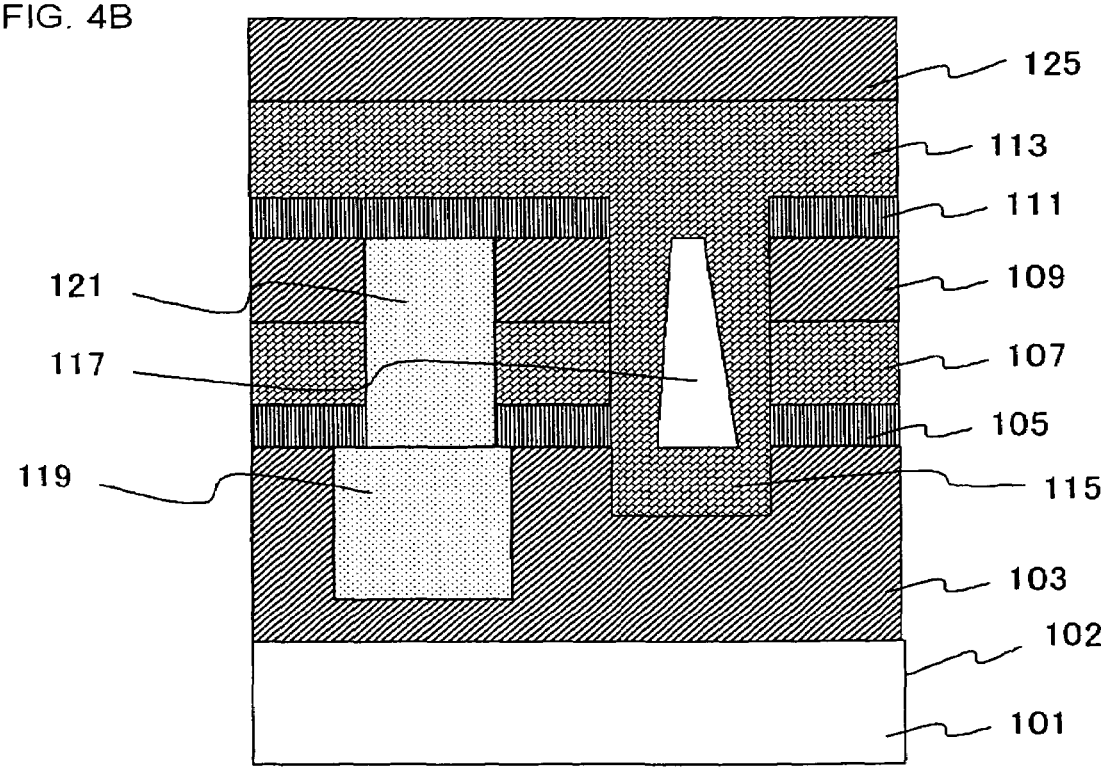

Proceeding to FIG. 4B, the $SiO_2$ film 125 is deposited on the SiOC film 113, to serve as a cap layer for the SiOC film 113. Then an etching process based on the photolithography for forming an interconnect is carried out sequentially on the $SiO_2$ film 125, SiOC film 113 and SiCN film 111 on the Cu plug 121, so as to form an interconnect trench. In the interconnect trench, the Ta/TaN layer (not shown) and the Cu film 119 are filled in. Then a CMP process is performed to remove the Cu film 119 remaining on the $SiO_2$ film 125, thus to obtain an upper interconnect.

It is to be noted that the silicon substrate 101 in the foregoing process actually represents a silicon wafer. When the silicon wafer is split by dicing after forming thereon a plurality of semiconductor devices, a plurality of individual semiconductor devices 100 is obtained, each of which has a dicing section 102. That is how the semiconductor device 100 shown in FIG. 1 is obtained. Further, after forming the semiconductor device 100 shown in FIG. 1, a SiCN film may be formed on the $SiO_2$ film 125, and an upper interconnect may be formed in a similar process to the above, in which case a multilayer low-k stacked structure including a desired number of interconnect layers.

The following passages cover the advantageous effect of the semiconductor device 100 shown in FIG. 1.

As shown in FIG. 1, the semiconductor device 100 includes the interface reinforcing film 115 provided so as to be buried in the concave portion 133 that penetrates the SiOC film 107 and the SiCN film 105 at a position close to the dicing section 102, and to be across the side face of the SiCN film 105 to that of the SiOC film 107. Accordingly, even when a nick emerges on the dicing section 102 because of the dicing operation and the nick provokes a crack at the interface between the SiOC film 107 and the SiCN film 105, the crack can be inhibited from propagating further along the interface.

The benefit of the semiconductor device 100 will be described further in comparison with a conventional structure.

Figure 5A:
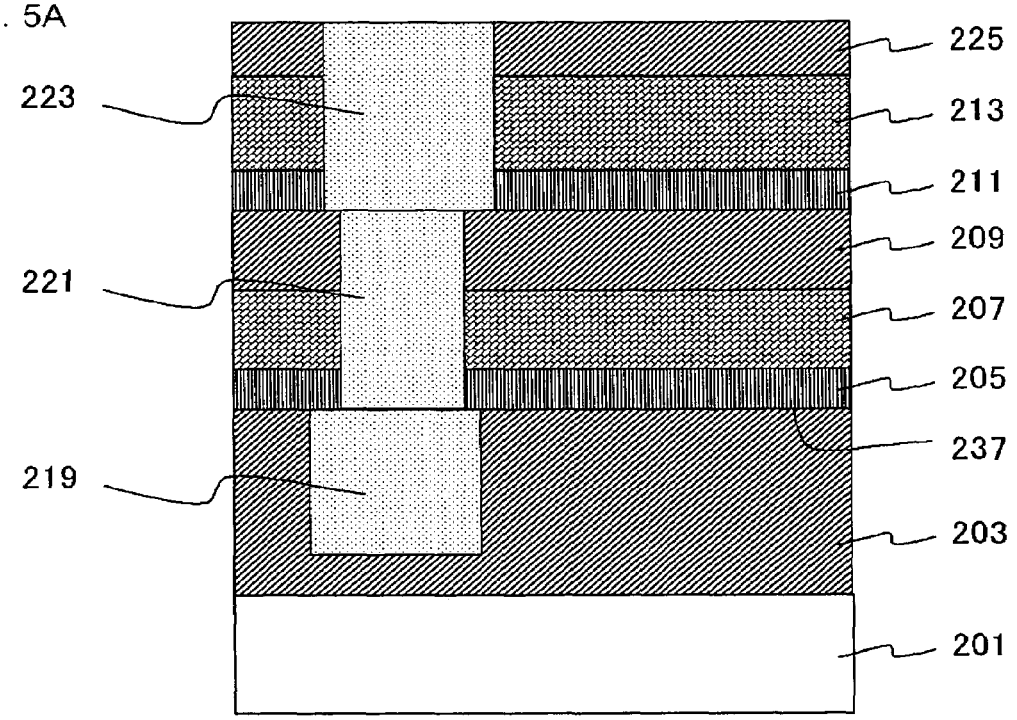
FIGS. 5A and 5B are schematic cross-sectional views showing a configuration of a semiconductor device.
Figure 5B:
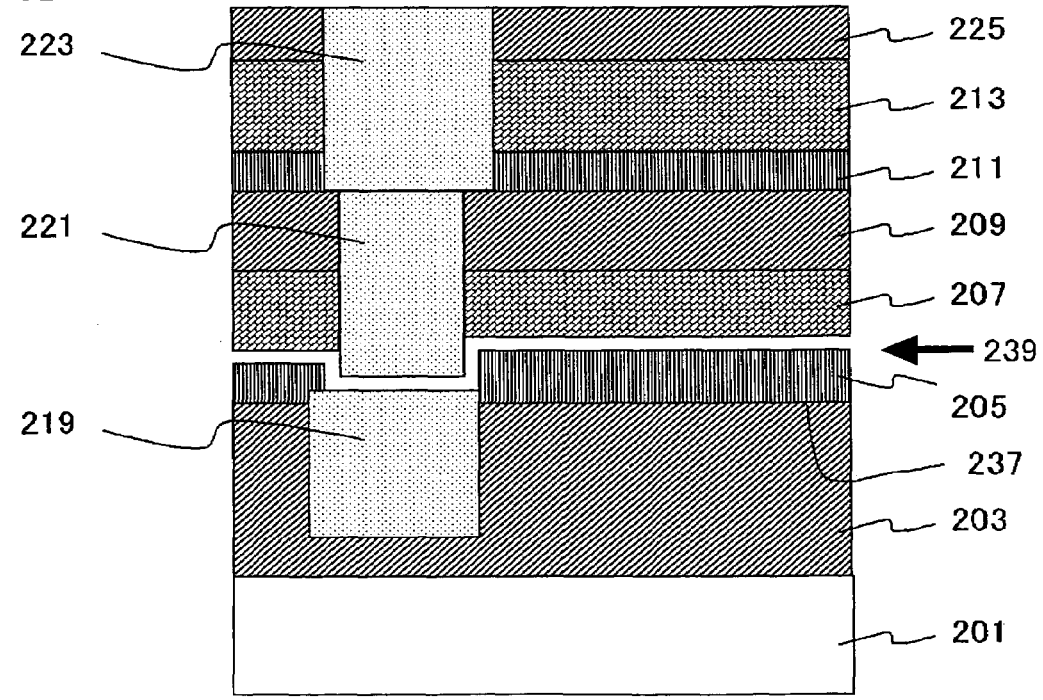

FIGS. 5A and 5B are schematic cross-sectional views showing a semiconductor device that does not include the interface reinforcing film 115. FIG. 5A depicts a state before emergence of a crack, while FIG. 5B depicts a state that the crack is generating. FIGS. 5A and 5B represent a portion of a multilayer interconnect structure formed through a single damascene process, in which a lower interconnect constituted of a Cu film 219 is connected to an upper interconnect constituted of a Cu film 223 via a Cu plug 221.

The lower interconnect constituted of the Cu film 219 is located in an insulating film 203. The Cu plug 221 is disposed through a hole penetrating stacked films including a SiCN film 205, a SiOC film 207, and a $SiO_2$ film 209 on the insulating film 203. The upper interconnect constituted of the Cu film 223 is located in stacked films including a SiCN film 211, a SiOC film 213 and a $SiO_2$ film 225.

As shown in FIGS. 5A and 5B, in a structure without the interface reinforcing film 115, once the crack 239 is generated the crack may advance along the interface, thus to even separate an entire interface, since a component that can restrain the propagation of the crack is not provided.

By contrast, FIG. 6 illustrates a state that a crack 139 has emerged on the dicing section 102 of the semiconductor device 100 shown in FIG. 1. Referring to FIG. 6, since the interface reinforcing film 115 including the air gap 117 is provided, the crack 139 can be impeded from propagating further inward along the interface between the SiCN film 105 and the SiOC film 107, by the presence of the air gap 117 in the interface reinforcing film 115. Therefore, a region inside the interface reinforcing film 115 can be securely protected.

As is now apparent, according to the present embodiment, providing the interface reinforcing film 115, which serves as a crack propagation barrier that inhibits the crack from inwardly propagating along the interface between the SiCN film 105 and the SiOC film 107, results in preventing the separation of the interface between the SiCN film 105 and the SiOC film 107.

Such advantageous effect can be prominently exhibited by extending the interface reinforcing film 115 downward into the insulating film 103 serving as the insulating interlayer of the interconnect layer that includes the Cu film 119, so that the interface reinforcing film 115 also covers a sidewall of the insulating film 103, as shown in FIG. 1. Also, the advantage can be enhanced by forming the interface reinforcing film 115 so as to cover an entire sidewall of the concave portion 133 corresponding to the SiOC film 107, the SiCN film 105 and the insulating film 103.

Further, the benefit is prominently offered when the interface reinforcing film 115 is provided in the same layer as the Cu plug 121, as the semiconductor device 100 shown in FIG. 1. Between an interconnect layer including an interconnect and a layer including a conductive plug that connects the interconnects included in different interconnect layers, the latter has a smaller footprint of the conductive material in the interface between the SiCN film 105 and the SiOC film 107. Accordingly, separation between layers is more prone to take place in an interface between a low dielectric constant film of an insulating interlayer in the layer including the conductive plug and an adjacent insulating film. However in this embodiment, since the interface reinforcing film 115 is located in the same layer as the Cu plug 121, propagation of a crack along the interface of a conductive plug layer having a smaller conductor footprint can be securely inhibited.

From another viewpoint, the SiOC film 107 which is a low dielectric constant film is disposed in contact with the SiCN film 105 and the $SiO_2$ film 109, as shown in FIG. 1. According to the findings of the present inventors, a crack is prone to emerge at the interface between the SiCN film 105 and the SiOC film 107. Accordingly, providing the interface reinforcing film 115 through this interface naturally suppresses the propagation of the crack. Presumably, it is because of a larger difference in film properties between the SiCN film 105 and the SiOC film 107 than that between the SiOC film 107 and the $SiO_2$ film 109, and because of weaker adhesion between the SiOC film 107 and the SiCN film 105 than between the SiOC film 107 and the $SiO_2$ film 109, that the crack more readily propagates along the interface between the SiOC film 107 and the SiCN film 105.

Also, the crack is more prone to propagate between insulating films that have largely different film properties from each other. Especially in a semiconductor device in which a low dielectric constant film such as a SiOC film is employed as an insulating interlayer, the strength of the interface between the low dielectric constant film of a smaller film density and an adjacent insulating film of a greater film density than the low dielectric constant film is not sufficient, and hence the crack can easily propagate once a nick is created on the dicing section 102. Further, the crack is particularly prone to propagate through a layer including the low dielectric constant film in which a conductive film has a small footprint.

Specific examples of such locations include:

(i) an interface between a lowermost low dielectric constant film among the low dielectric constant films including a conductive plug and a lower adjacent insulating film; and (ii) an upper most low dielectric constant film among the low dielectric constant films including a conductive plug and a lower adjacent insulating film.

Based on the above, when applying the structure of the semiconductor device 100 according to FIG. 1 to a multilayer interconnect structure, providing the interface reinforcing film 115 in the following locations effectively suppresses the crack propagation along the interface between the SiOC film and the SiCN film.

(I) An uppermost conductive plug layer among those including a SiOC film as an insulating interlayer; or (II) A lowermost conductive plug layer among those including a SiOC film as an insulating interlayer.

Figure 7:
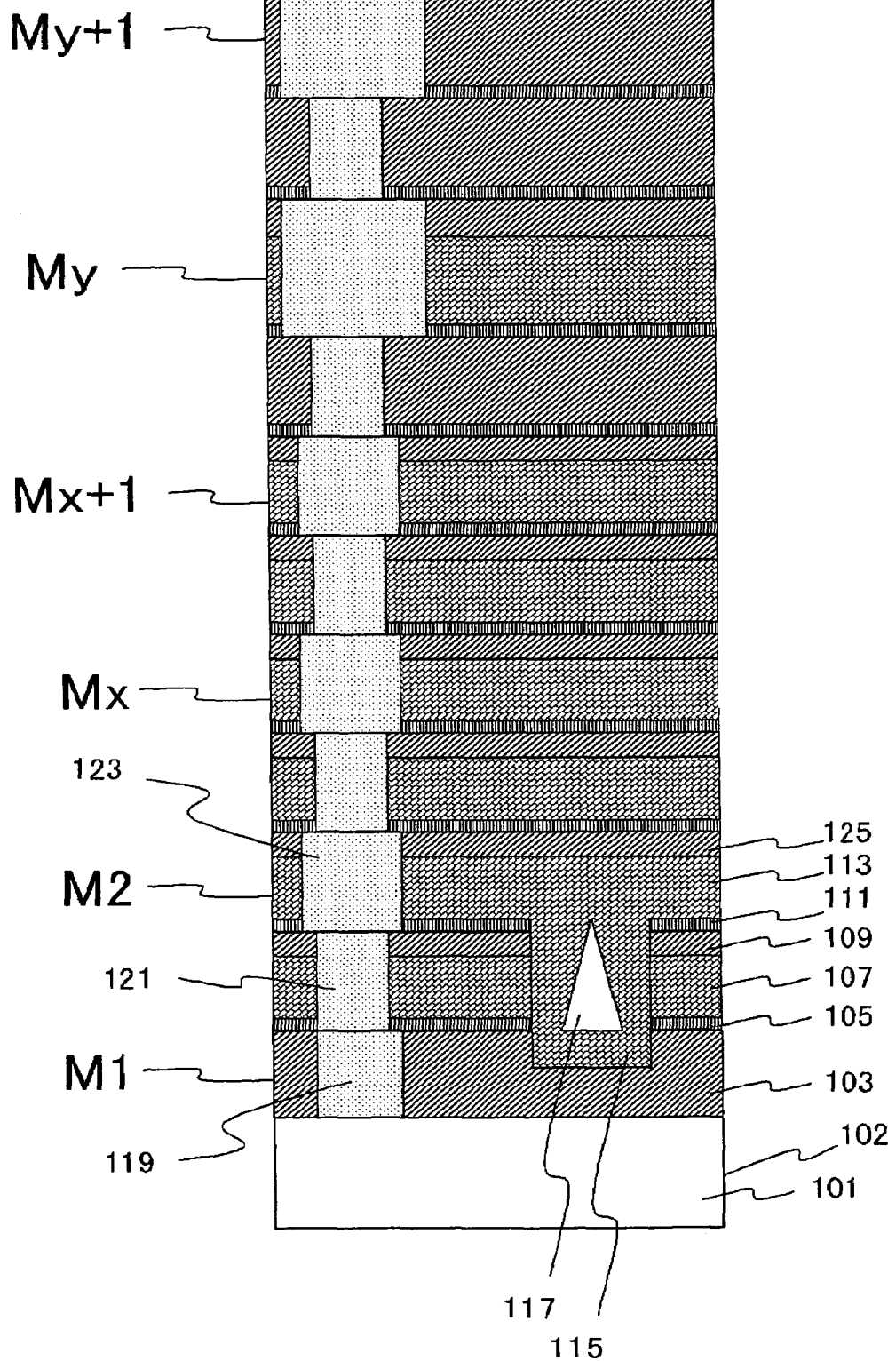
FIG. 7 is a schematic cross-sectional view showing a configuration of a semiconductor device according to the embodiment.
Figure 8:
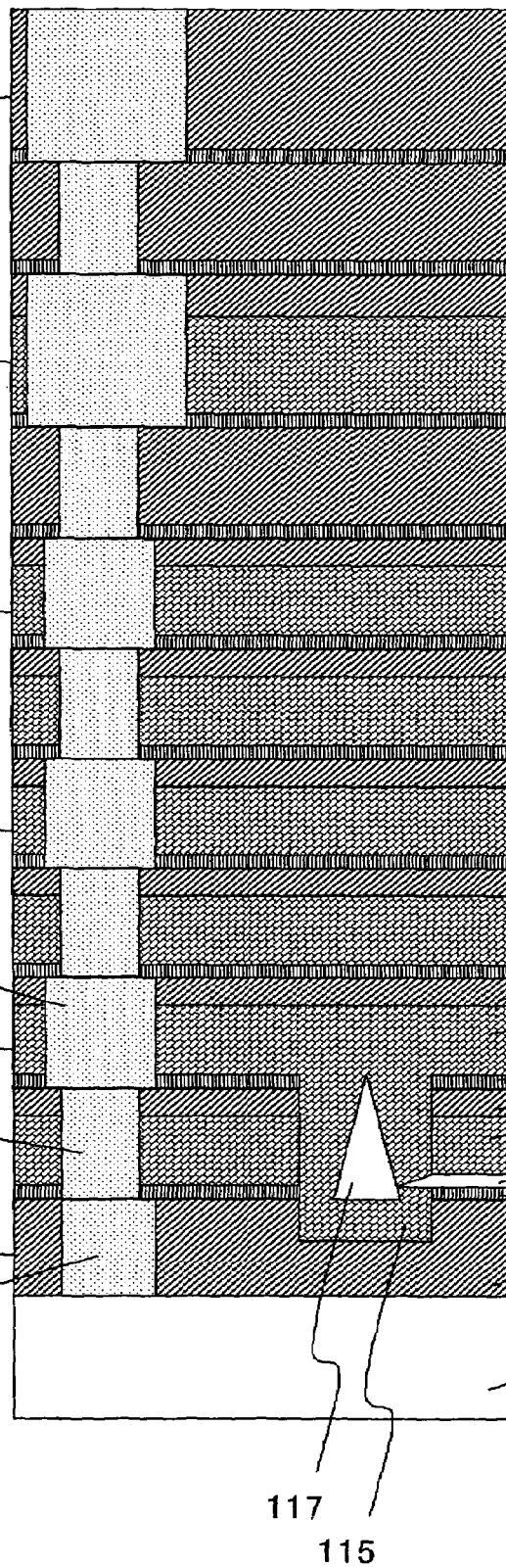
FIG. 8 is a schematic cross-sectional view showing a configuration of a semiconductor device according to the embodiment.
Figure 9:
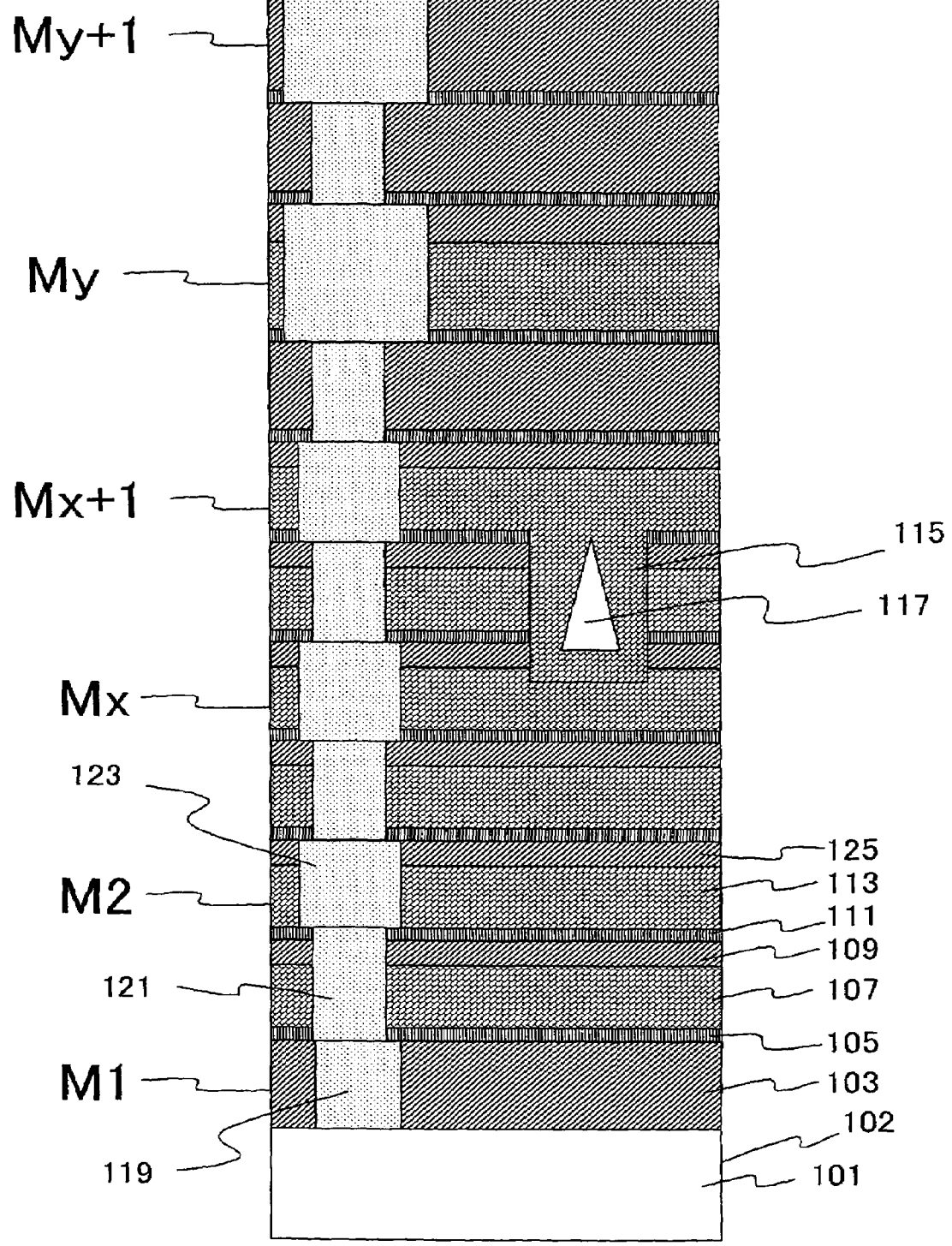
FIG. 9 is a schematic cross-sectional view showing a configuration of a semiconductor device according to the embodiment.

FIGS. 7 to 9 are schematic cross-sectional views respectively showing a semiconductor device including a larger number of stacked layers, in which the structure of the semiconductor device 100 of FIG. 1 is incorporated. FIGS. 7 and 8 represent a configuration in which the interface reinforcing film 115 is provided at the position of (I) above. FIG. 7 illustrates a state free from a crack on the dicing section 102, while FIG. 8 depicts a state where the crack 139 has emerged on the dicing section 102. In such a structure also, the interface reinforcing film 115 effectively inhibits the propagation of the crack 139.

FIG. 9 represents a configuration of a semiconductor device in which the interface reinforcing film 115 is provided at the position of (II) above. Here, the structure of FIG. 7 and FIG. 9 may be adopted at a time, in other words the interface reinforcing film 115 may be provided at both of the positions (I) and (II). Such configuration further ensures the inhibiting effect against the separation at the interface of the insulating films in the semiconductor device.

Referring to FIGS. 7 to 11, as well as to FIGS. 19 to 21 which will be described later, the symbol M designates an interconnect layer, and the structure respectively shown therein includes the interconnect layers numbered as M1, M2, ..., Mx, Mx+1, My, My+1 starting from the side of the silicon substrate 101. The interconnect layers M2 to Mx+1 includes a SiOC film as an insulating interlayer. In the interconnect layers My and My+1, the insulating interlayer is constituted of a $SiO_2$ film.

Figure 10:
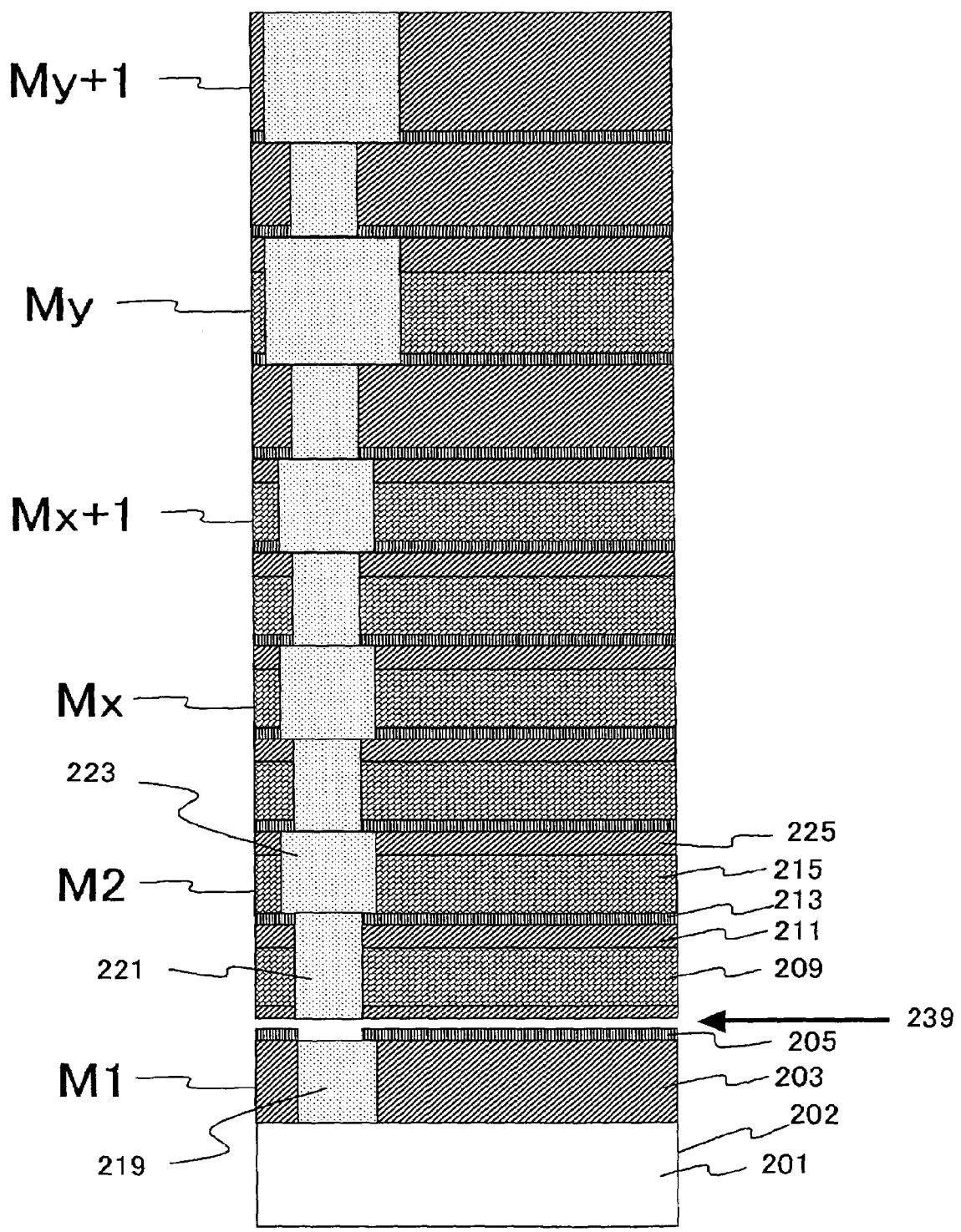
FIG. 10 is a schematic cross-sectional view showing a configuration of a semiconductor device.
Figure 11:
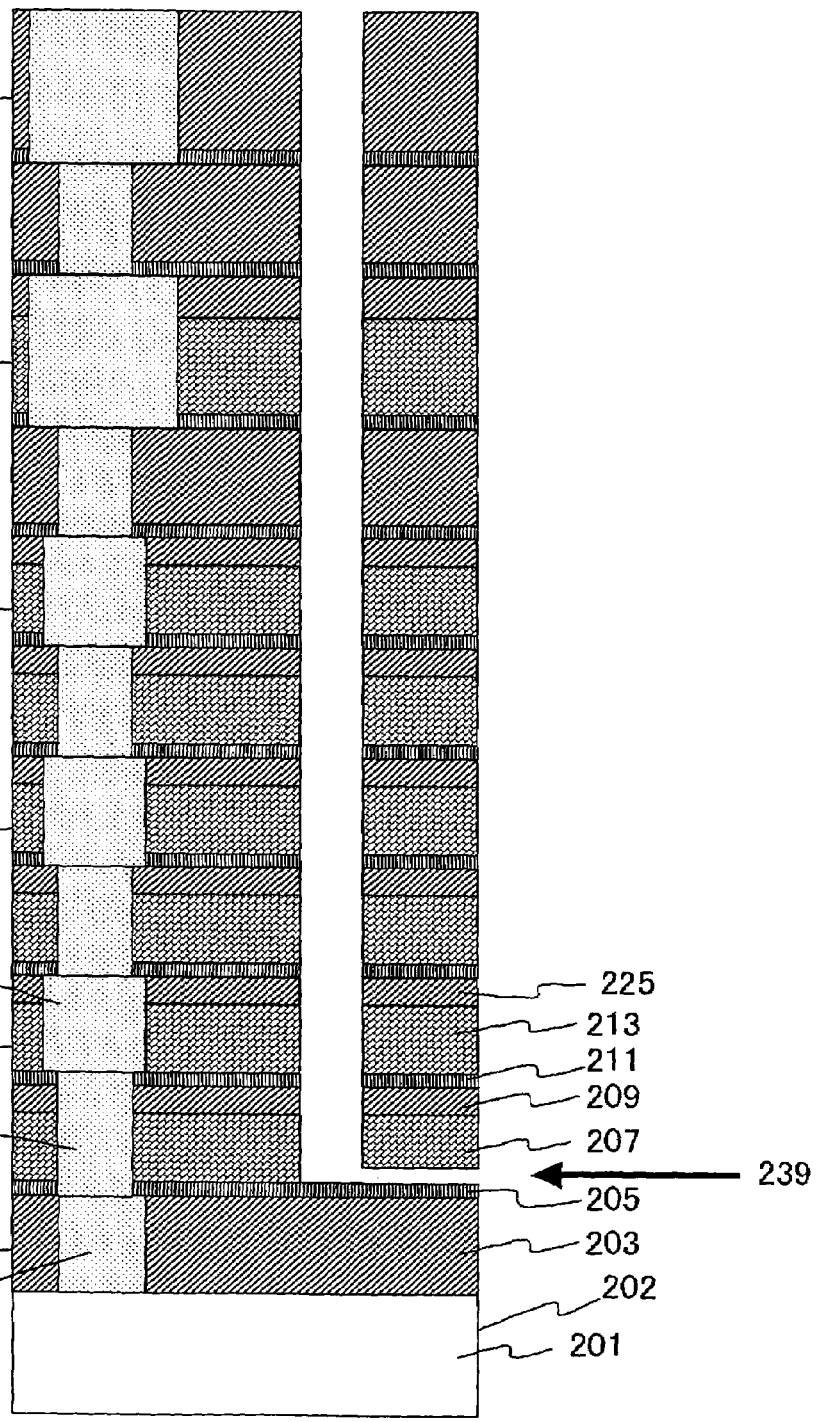
FIG. 11 is a schematic cross-sectional view showing a configuration of a semiconductor device.

FIGS. 10 and 11 depict semiconductor devices including a multilayer interconnect structure, but not provided with the interface reinforcing film 115. FIG. 10 represents a configuration in which the structure of a semiconductor device as shown in FIGS. 5A and 5B is applied to the multilayer interconnect structure. In these cases, since the interface reinforcing film 115 is not provided, a crack 239 is provoked at the interface between the SiCN film 205 and the SiOC film 207, once a nick is created on the dicing section 202 by the dicing operation. Then the crack can freely propagate to an inner region of a silicon substrate 201 along the same interface, thus to even incur an entire separation.

FIG. 11 illustrates the structure of the semiconductor device shown in FIG. 10, but in which a groove is formed so as to penetrate the SiOC film 207 and all the upper layers. This configuration corresponds to the structure disclosed in the foregoing patented document 1. The penetrating groove can inhibit the propagation of the crack 239 originated at the dicing section 202. However in this structure, the groove of a high aspect ratio has to be formed from the element forming surface of the chip on the silicon substrate 201 all the way down to a bottom face of the SiOC film 207, after completing the formation of the multilayer interconnect structure. Therefore, this technique still has to be improved, from the viewpoint of maintaining the stability of the products through the manufacturing process.

By contrast, in the semiconductor devices shown in FIGS. 7 to 9, providing the interface reinforcing film 115 in advance at a position where the layer separation is prone to take place eliminates the need to form a groove of a high aspect ratio, and hence secures the product stability through the manufacturing process. Further, since the interface reinforcing film 115 can be simultaneously formed when depositing the SiOC film 113, the manufacturing process can be simplified.

Figure 12:
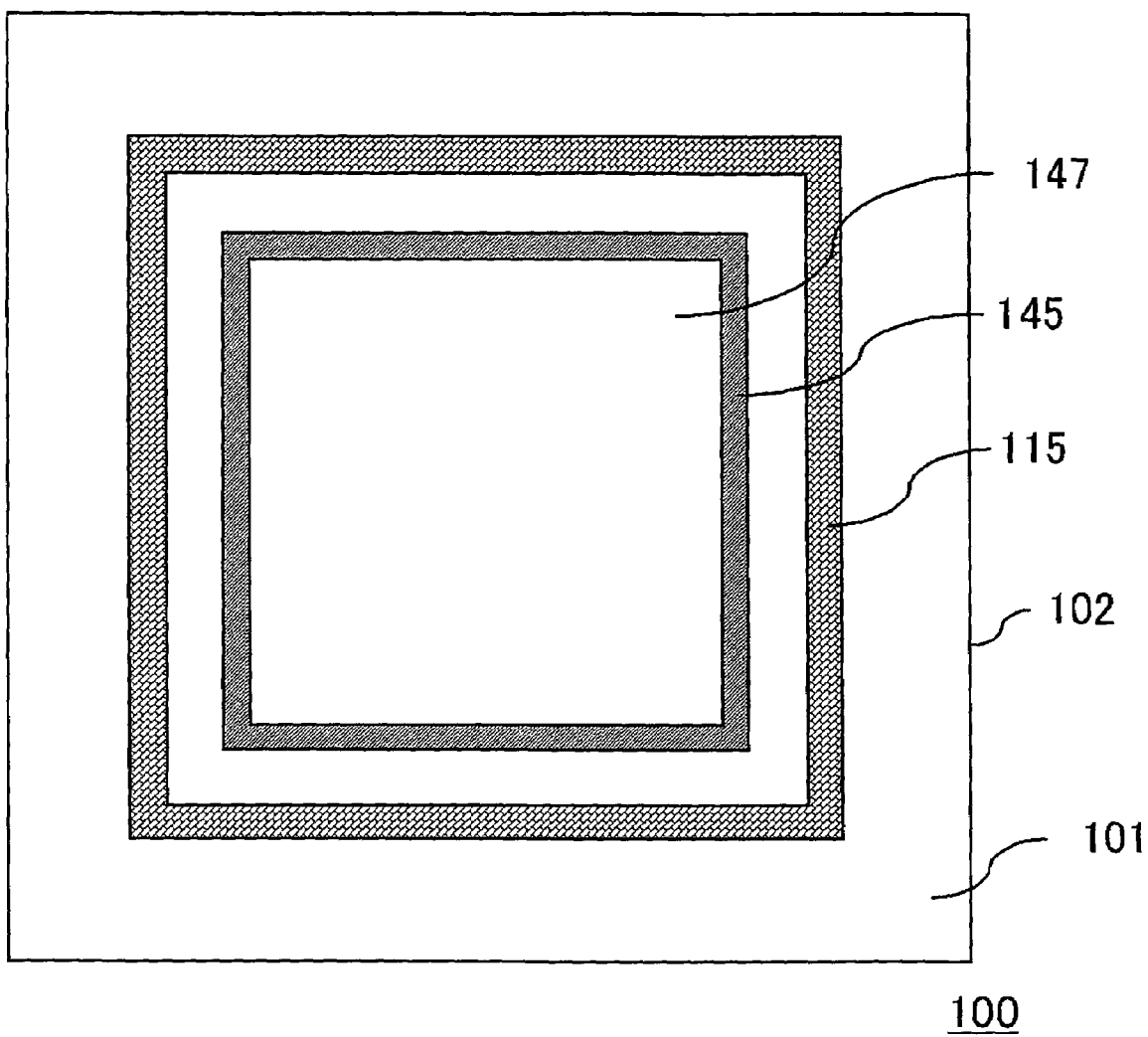
FIG. 12 is a schematic plan view showing a configuration of a semiconductor device according to the embodiment.

A plan-view layout of the semiconductor device 100 of FIG. 1 is shown in FIG. 12, for instance. Referring to FIG. 12, a guard ring 145 is provided along an outer periphery of an element forming region 147 formed on the front face of the silicon substrate 101. The guard ring 145 is a conductive member buried in a form of a groove, in an insulating film provided on the silicon substrate 101. Also, the stripe-shaped interface reinforcing film 115 is located along the entire peripheral region, so as to surround the guard ring 145.

Providing the interface reinforcing film 115 so as to serve as a liner along the entire periphery of the element forming region 147 as shown in FIG. 12 allows effectively restrains the layer separation originating from the dicing section 102. Also, locating the interface reinforcing film 115 at an outer position of the guard ring 145 securely interrupts the crack propagation outside the guard ring 145. Therefore, moisture that penetrates through the insulating interlayer from the dicing section 102 can be blocked, and hence the moisture repellency reliability of the element provided in the element forming region 147 can be upgraded. Consequently, the element forming region 147 can be more securely protected.

Providing thus the interface reinforcing film 115 along a boundary between a region where an element is located and another region allows inhibiting the crack propagation into the region where the element is located. Accordingly, such configuration protects the element from being damaged. This advantage can be prominently enjoyed when the interface reinforcing film 115 is provided along the entire boundary.

Although the foregoing description refers to an interconnect structure formed through a single damascene process, the structure including the interface reinforcing film 115 may also be incorporated in an interconnect structure formed through a dual damascene process.

Figure 13:
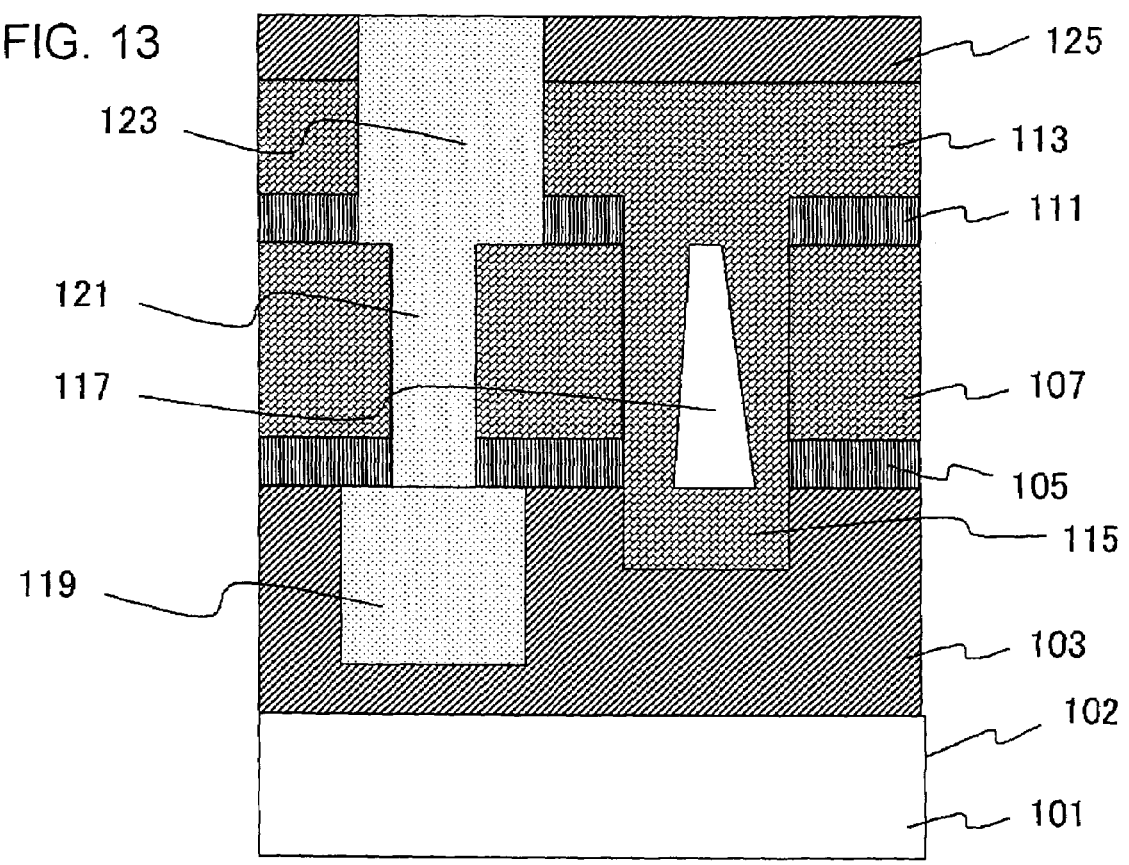
FIG. 13 is a schematic cross-sectional view showing a configuration of a semiconductor device according to the embodiment.
Figure 14:
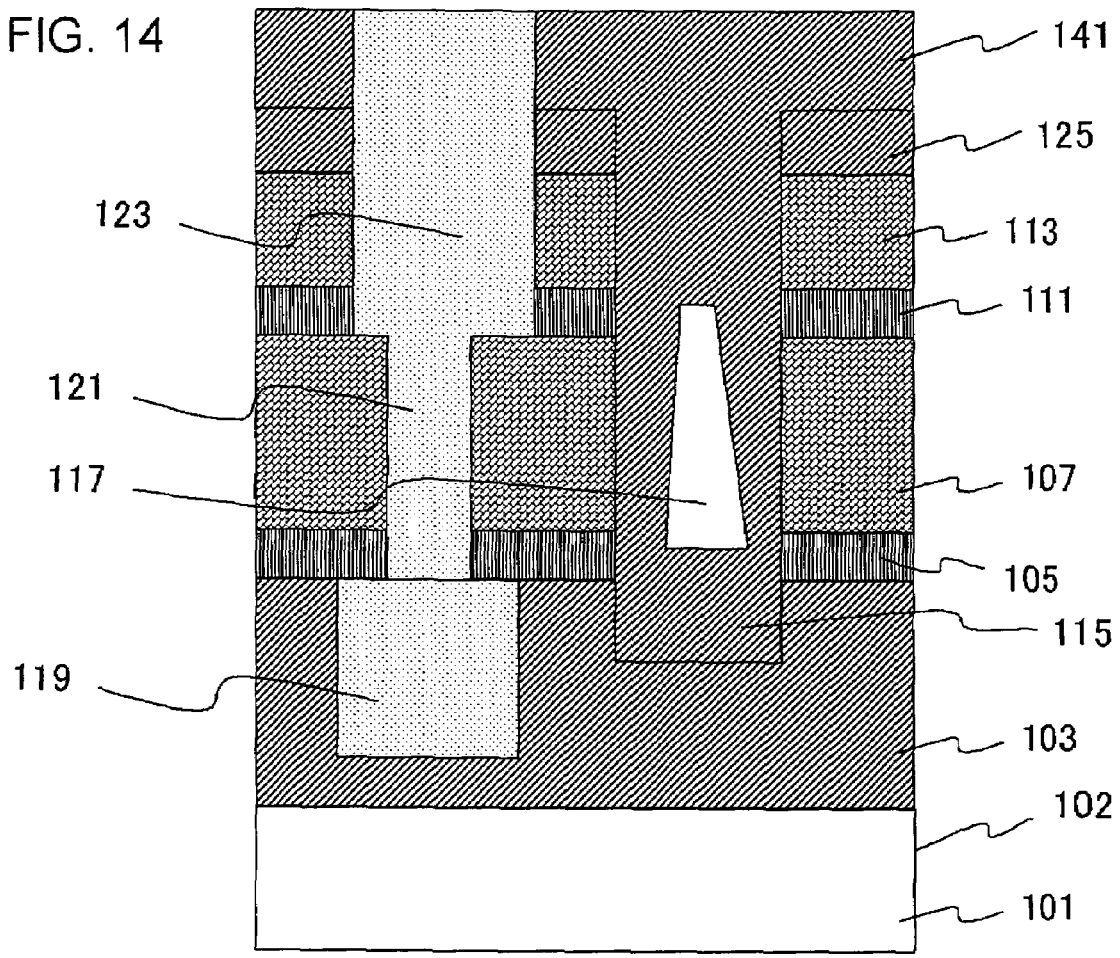
FIG. 14 is a schematic cross-sectional view showing a configuration of a semiconductor device according to the embodiment.

FIGS. 13 and 14 are schematic cross-sectional views showing a structure formed through a dual damascene process, to which the structure of the semiconductor device 100 of FIG. 1 is applied. The semiconductor devices shown in FIGS. 13 and 14 do not include the SiO$_2$ film 109, and hence the SiCN film 111 is provided in direct contact with the SiOC film 107.

FIG. 13 includes a Cu film integrally constituted of the Cu plug 121 and the Cu film 123 in a continuous structure. In this case also, the SiOC film 113 is filled in the concave portion penetrating the films from the SiCN film 111 to the insulating film 103, so as to cover a sidewall of the concave portion with the SiOC film 113 and to form the interface reinforcing film 115 with the air gap 117 at a time, by which the similar advantages to those offered by the semiconductor device 100 of FIG. 1 can be obtained.

In the semiconductor device shown in FIG. 13 also, the groove-shaped concave portion 133 may be formed after depositing the SiCN film 111 which serves as an etching stopper, and then the SiOC film 113 may be filled in the concave portion 133 thus to form the interface reinforcing film 115, as described referring to FIG. 3B.

FIG. 14 depicts a structure according to the semiconductor device 100 of FIG. 1, but in which a SiO$_2$ film 141 is provided on the SiO$_2$ film 125. The concave portion is formed through the films from the SiO$_2$ film 125 to the insulating film 103, and the SiO$_2$ film 125 is filled in the concave portion so as to cover a sidewall thereof, and to form the interface reinforcing film 115 with the air gap 117 at a time. Such configuration can also effectively suppress the layer separation originating from the dicing section 102.

The structure shown in FIG. 14 may be formed through the following steps. After providing a hard mask to the SiOC film 113 by forming thereon the SiO$_2$ film 125, the groove-shaped concave portion 133 is formed. Then another SiO$_2$ film 141 is formed so as to serve as a hard mask insulating film, and to fill in the concave portion 133. At this stage, the SiO$_2$ film 141 is made to include the air gap 117, in the concave portion 133. This having been completed, an ordinary dual damascene process is carried out.

Still referring to FIG. 14, the interface reinforcing film 115 may be constituted of an insulating film other than a low dielectric constant film such as a SiO$_2$ film. Nevertheless, it is preferable to employ a low dielectric constant film such as the SiOC film 113, to constitute the interface reinforcing film 115. Employing the low dielectric constant film allows enhancing the adhesion between the interface reinforcing film 115 and the SiOC film 107. Also, since the low dielectric constant film has a smaller film density in general, employing such a material ensures the suppressing effect against the crack propagation.

Second Embodiment

Figure 15:
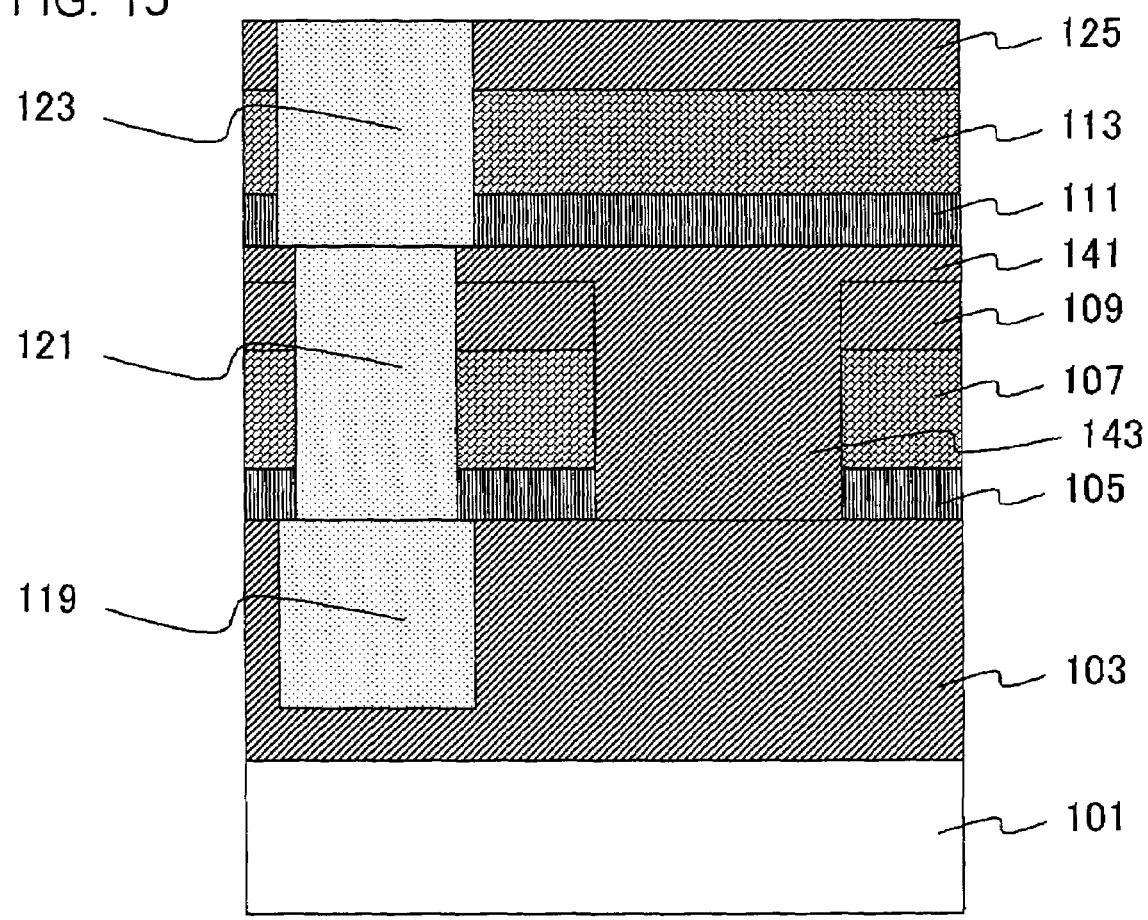
FIG. 15 is a schematic cross-sectional view showing a configuration of a semiconductor device according to an embodiment of the present invention.

FIG. 15 is a schematic cross-sectional view showing a configuration of a semiconductor device according to a present embodiment of the present invention. The semiconductor device 110 shown in FIG. 15 includes an interconnect layer having a fundamental structure in common with that of the semiconductor device 100 according to the first embodiment, however the structure of the interface reinforcing film is different.

The semiconductor device 110 includes an interface reinforcing film 143 of a solid structure, in place of the interface reinforcing film 115 in the semiconductor device 100 of FIG. 1. Also, a SiO$_2$ film 141 is interposed between the SiO$_2$ film 109 and the SiCN film 111, and the interface reinforcing film 143 in continuously and integrally formed with the SiO$_2$ film 141. The interface reinforcing film 143 is located so as to fill the concave portion penetrating the SiO$_2$ film 109, the SiOC film 107 and the SiCN film 105 in this sequence, so that a bottom face of the interface reinforcing film 143 is aligned with a bottom face of the SiCN film 105.

The following passages provide the description on a method of manufacturing the semiconductor device shown in FIG. 15. FIGS. 16A, 16B, 17A, 17B and 18 are schematic cross-sectional views sequentially showing the manufacturing process of the semiconductor device 110 of FIG. 15. Hereunder, differences from the manufacturing process of the semiconductor device 100 of FIG. 1 will be primarily described.

Figure 16A:
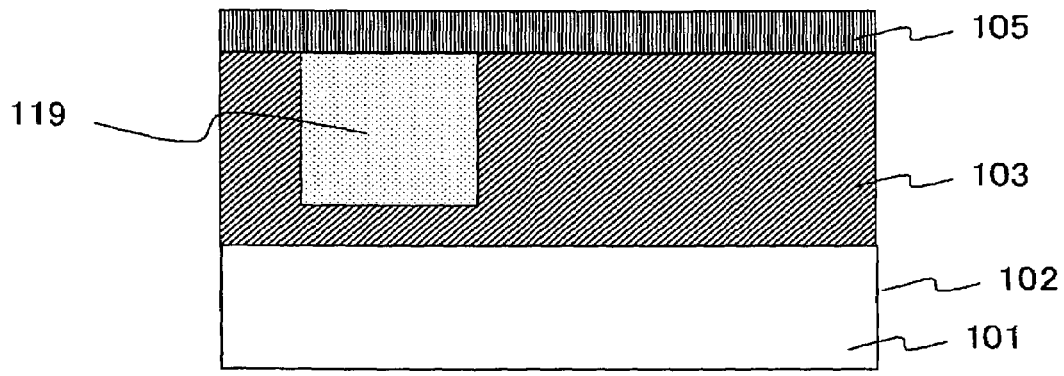
FIGS. 16A and 16B are schematic cross-sectional views for explaining a manufacturing process of the semiconductor device according to the embodiment.
Figure 16B:
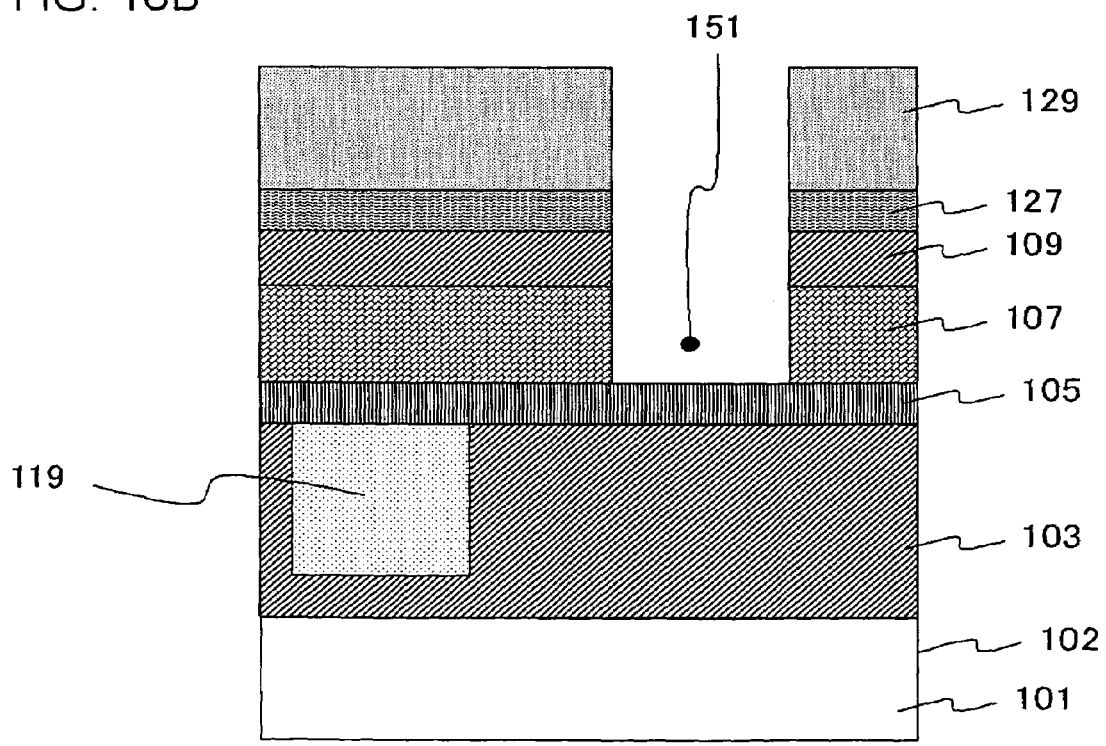

FIG. 16A represents a state where the steps up to the formation of the SiCN film 105 on the silicon substrate 101 have been completed, by the method described referring to FIG. 2A. On the SiCN film 105, the SiOC film 107 and the SiO$_2$ film 109 are sequentially formed. Further on the SiO$_2$ film 109, the anti-reflection film 127 and the resist film 129 are sequentially formed. Then utilizing the resist film 129 as the mask, a groove-shaped concave portion 151 is formed so as to penetrate the SiO$_2$ film 109 and the SiOC film 107 (FIG. 16B). At this stage, concave portion 151 is formed in a smaller aspect ratio than that of the concave portion 133 of the first embodiment. Preferably, the concave portion 151 is formed in a width of 500 nm to 2 μm, more specifically 1 μm.

Figure 17A:
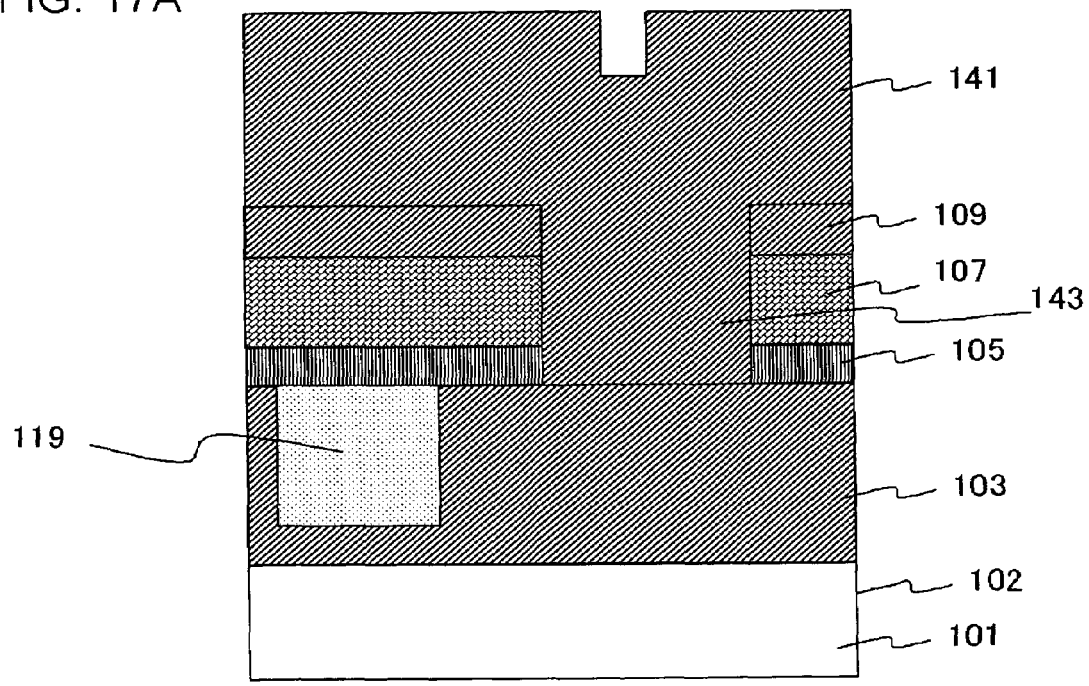
FIGS. 17A and 17B are schematic cross-sectional views for explaining a manufacturing process of the semiconductor device according to the embodiment.

Proceeding to FIG. 17A, the resist film 129 and the anti-reflection film 127 are removed. Then the SiO$_2$ film 141 is deposited all over the upper surface of the SiO$_2$ film 109, so as to also fill the concave portion 151, for example by a CVD process. Filling thus the concave portion 151 with the SiO$_2$ film 141 results in the formation of the solid-structured interface reinforcing film 143.

Figure 17B:
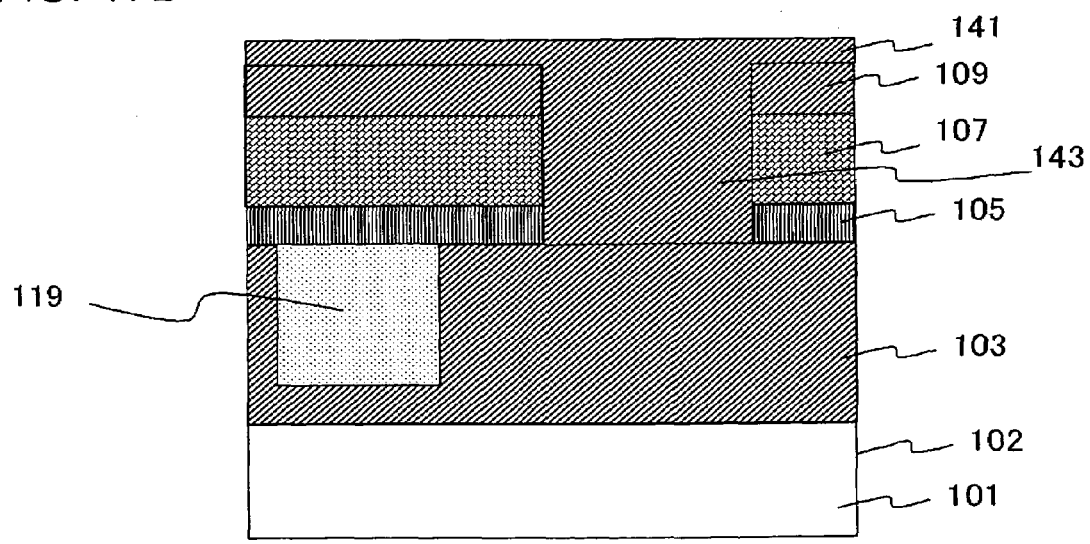
Figure 18:
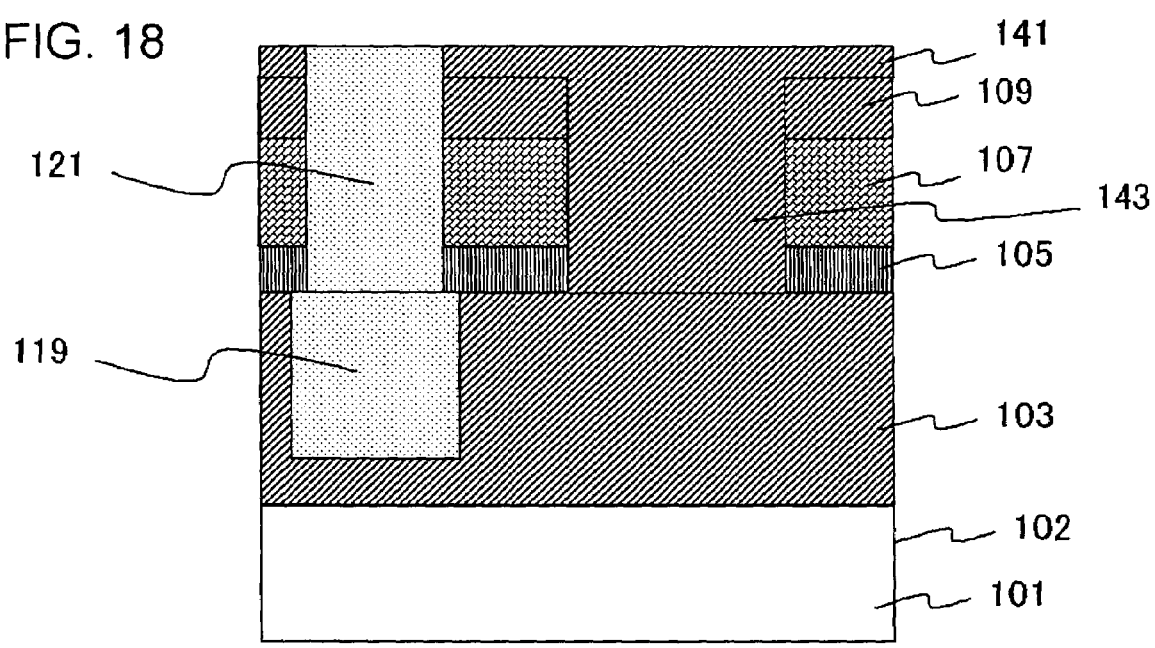
FIG. 18 is a schematic cross-sectional view for explaining a manufacturing process of the semiconductor device according to the embodiment.

At FIG. 17B, a CMP process is performed to make the SiO$_2$ film 141 thinner. Then referring to FIG. 18, the Cu plug 121 is formed so as to penetrate the SiO$_2$ film 141, the SiO$_2$ film 109, the SiOC film 107 and the SiCN film 105, by the method described referring to FIG. 2A.

Finally the SiCN film 111, the SiOC film 113 and the SiO$_2$ film 125 are deposited in this sequence on the SiO$_2$ film 141, and the Cu film 123 is formed by the method described referring to FIG. 4B. That is how the semiconductor device 110 shown in FIG. 15 is obtained.

The benefit of the semiconductor device 110 of FIG. 15 will now be described hereunder.

In the semiconductor device 110 shown in FIG. 15 as well, a concave portion is formed through the interface between the SiCN film 105 and the SiOC film 107, and the interface reinforcing film 143 is provided so as to cover an entire sidewall of the concave portion. Accordingly, even when a crack is created at the interface between the SiCN film 105 and the SiOC film 107 from a nick that has emerged on the dicing section 102, the interface reinforcing film 143 can interrupt the propagation of the crack as in the first embodiment. Consequently, the separation at the interface between the SiCN film 105 and the SiOC film 107 can be prevented.

Also, since the interface reinforcing film 143 provided in the semiconductor device 110 is of a solid structure, the concave portion 151 does not have to be extended into the insulating film 103, which simplifies the overall structure of the device.

Figure 19:
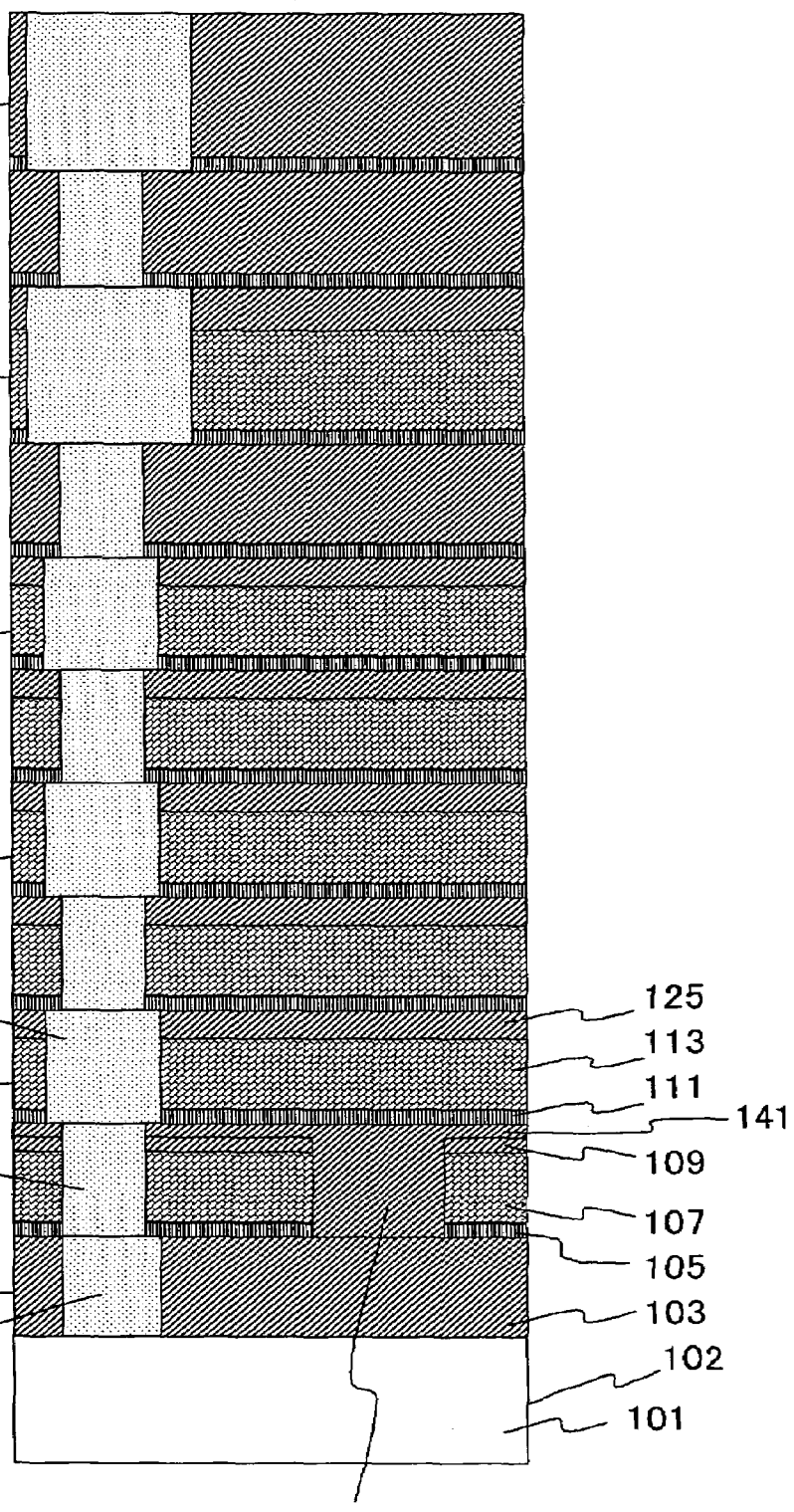
FIG. 19 is a schematic cross-sectional view showing a configuration of a semiconductor device according to the embodiment.
Figure 20:
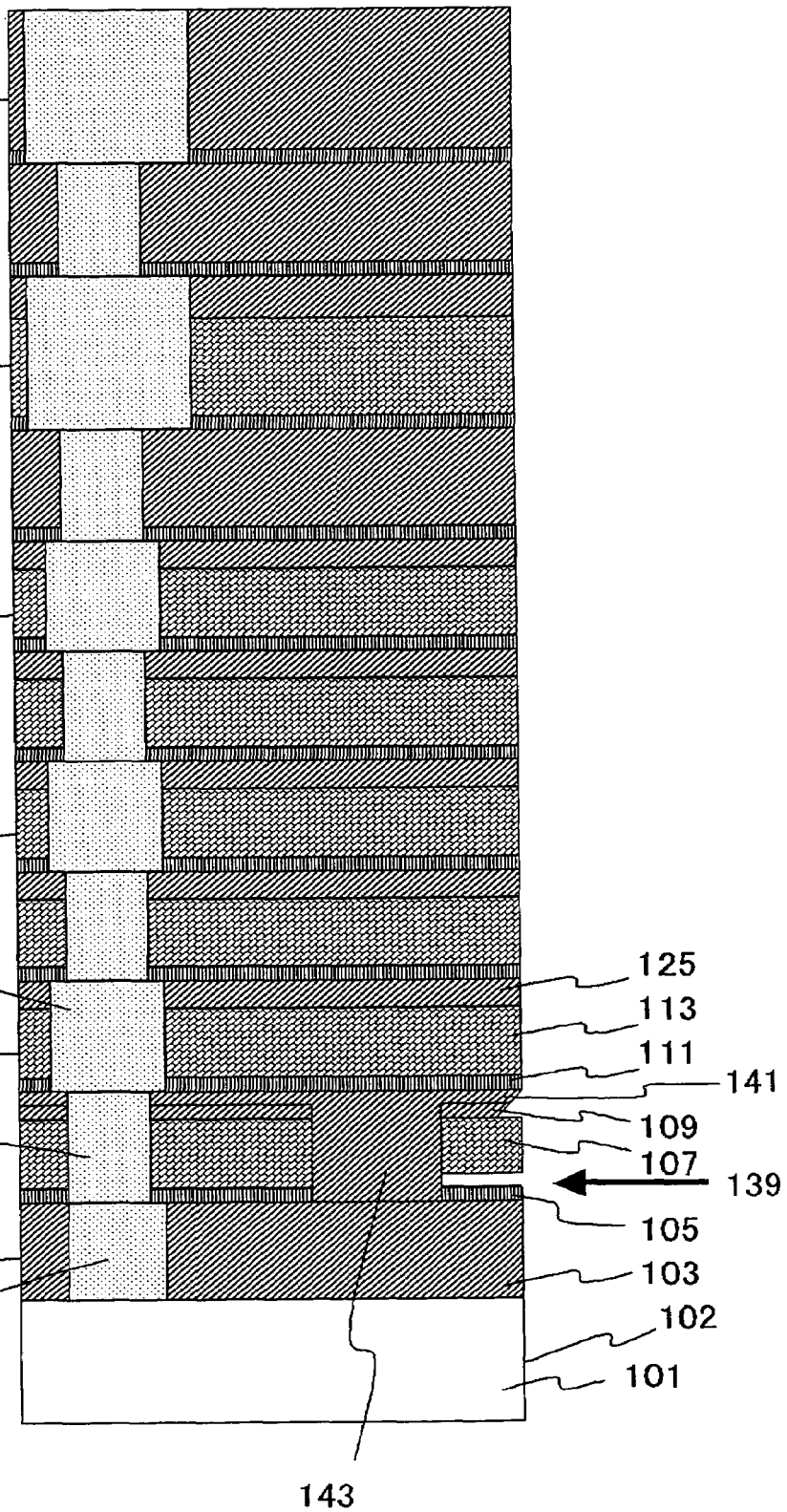
FIG. 20 is a schematic cross-sectional view showing a configuration of a semiconductor device according to the embodiment.
Figure 21:
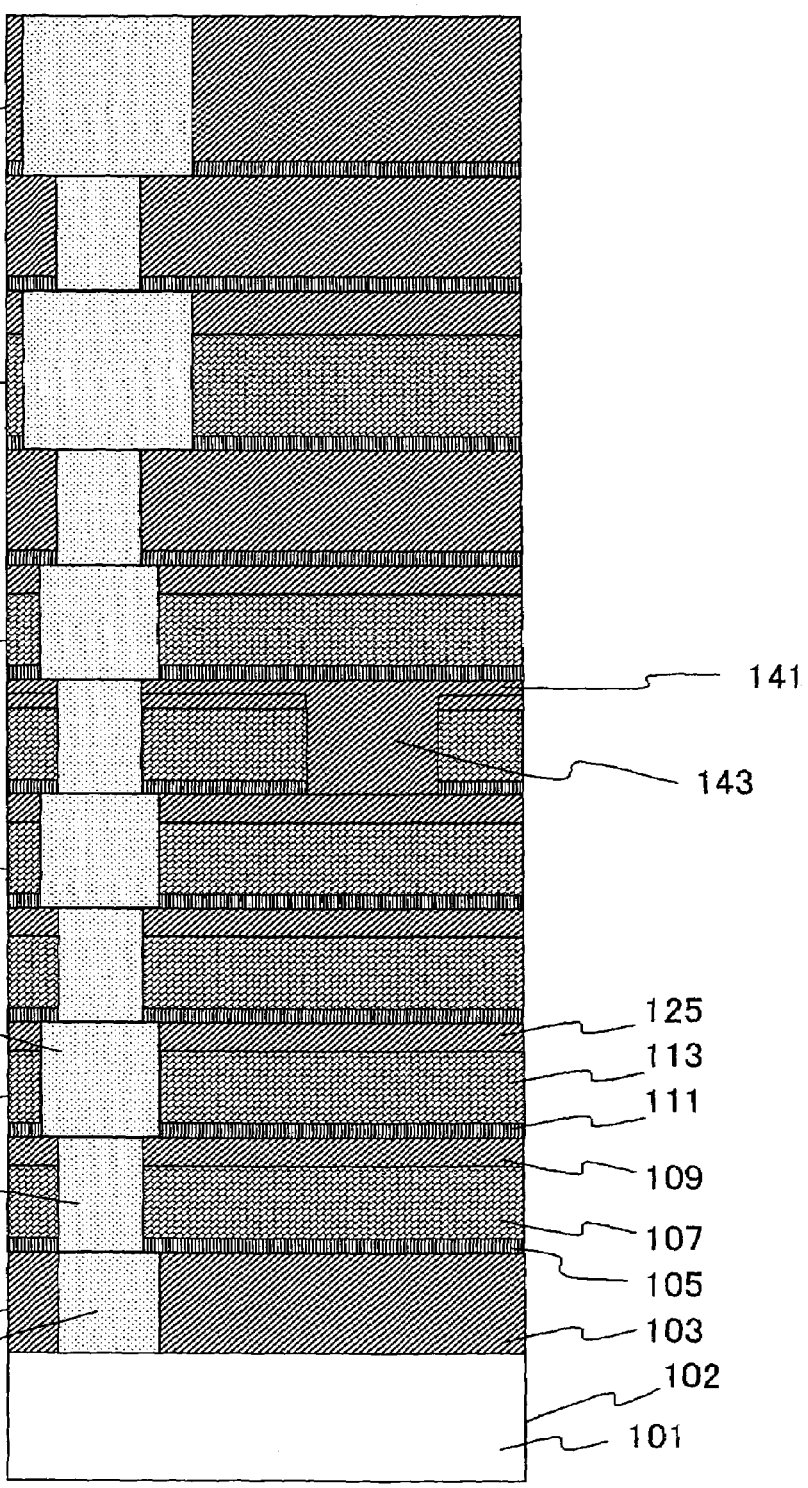
FIG. 21 is a schematic cross-sectional view showing a configuration of a semiconductor device according to the embodiment.

FIGS. 19 to 21 are schematic cross-sectional views respectively showing a semiconductor device including a larger number of stacked layers, in which the structure of the semiconductor device 110 of FIG. 15 is incorporated. FIGS. 19 and 20 represent a configuration in which the interface reinforcing film 143 is provided at the position (I) described in the first embodiment. FIG. 19 illustrates a state free from a crack on the dicing section 102, while FIG. 20 depicts a state where the crack 139 has emerged on the dicing section 102. In such a structure also, the interface reinforcing film 143 effectively inhibits the propagation of the crack 139.

FIG. 21 represents a configuration of a semiconductor device in which the interface reinforcing film 143 is provided at the position (II) described in the first embodiment. Here, the structure of FIG. 19 and FIG. 21 may be adopted at a time, in other words the interface reinforcing film 143 may be provided at both of the positions (I) and (II). Such configuration further ensures the inhibiting effect against the separation at the interface of the insulating films in the semiconductor device.

A plan-view layout of the semiconductor device 110 of FIG. 15 may be as shown in FIG. 12 referred to in the first embodiment. In the present embodiment as well, providing the interface reinforcing film 143 at an outer pheriphery of the element forming region and the guard ring 145 allows suppressing the propagation of the crack that has emerged on the dicing section 102 toward the guard ring 145 or the element forming region 147. Consequently, the element formed in the element forming region can be effectively protected.

Although the foregoing description is based on the assumption that the interconnect structure in the semiconductor device 115 has been formed through a single damascene process, the structure of the semiconductor device 115 may also be applied to an interconnect structure formed through a dual damascene process, as in the first embodiment.

In the foregoing embodiments, the SiOC film is used as the insulating interlayer having a low dielectric constant, while a hydrogen polysiloxane film, a methyl polysiloxane film, a methyl hydrogen polysiloxane film, or any of these having a porous structure may be employed as the low dielectric constant film, in place of the SiOC film. Also, the low dielectric constant film may be constituted of an organic polymer. A specific dielectric constant of the low dielectric constant film may be specified as 3.5 or smaller, for example. The low dielectric constant film may contain Si, O and H as a constituent element. Further, the low dielectric constant film may contain Si, C, O and H as a constituent element. In all such cases, adopting the structure according to the foregoing embodiments effectively allows the crack propagation along the interface between the low dielectric constant film and the diffusion barrier film located right thereunder.

While the foregoing embodiments refer to a structure in which the diffusion barrier film provided right under the SiOC film is constituted of the SiCN film, the diffusion barrier may be constituted of a SiC layer, a SiN layer or a SiON layer, instead of the SiCN film.

Also, though the SiOC film 107 is located in contact with the SiCN film 105 in the above embodiments, a thin film may be interposed between these insulating films, as long as the interface reinforcing film 115 effectively protects the region between the SiCN film 105 and the SiOC film 107.

Further, in the foregoing embodiments, in place of the pair of insulating films including the SiCN film 105 and the SiOC film 107, the concave portion 133 may be formed through stacked layers including insulating films having different film properties from each other, and the interface reinforcing film 115 may be provided along the entire sidewall of such concave portion. Though an interface between insulating films having different film properties generally lacks in adhesion strength, providing the interface reinforcing film 115 can suppress propagation of a crack, which may be created at the interface between the insulating films.

Third Embodiment

While the foregoing embodiments represent a configuration in which the guard ring 145, and the interface reinforcing film surrounding the guard ring, are disposed sequentially from the inner part to the circumference on the main surface of the silicon substrate 101 along a periphery of an element forming region including a multilayer interconnect structure, the present invention may also be applied to a semiconductor device provided with a fuse. Such embodiment will be described hereunder, based on a structure including the interface reinforcing film 115 of the first embodiment for example.

Figure 22:
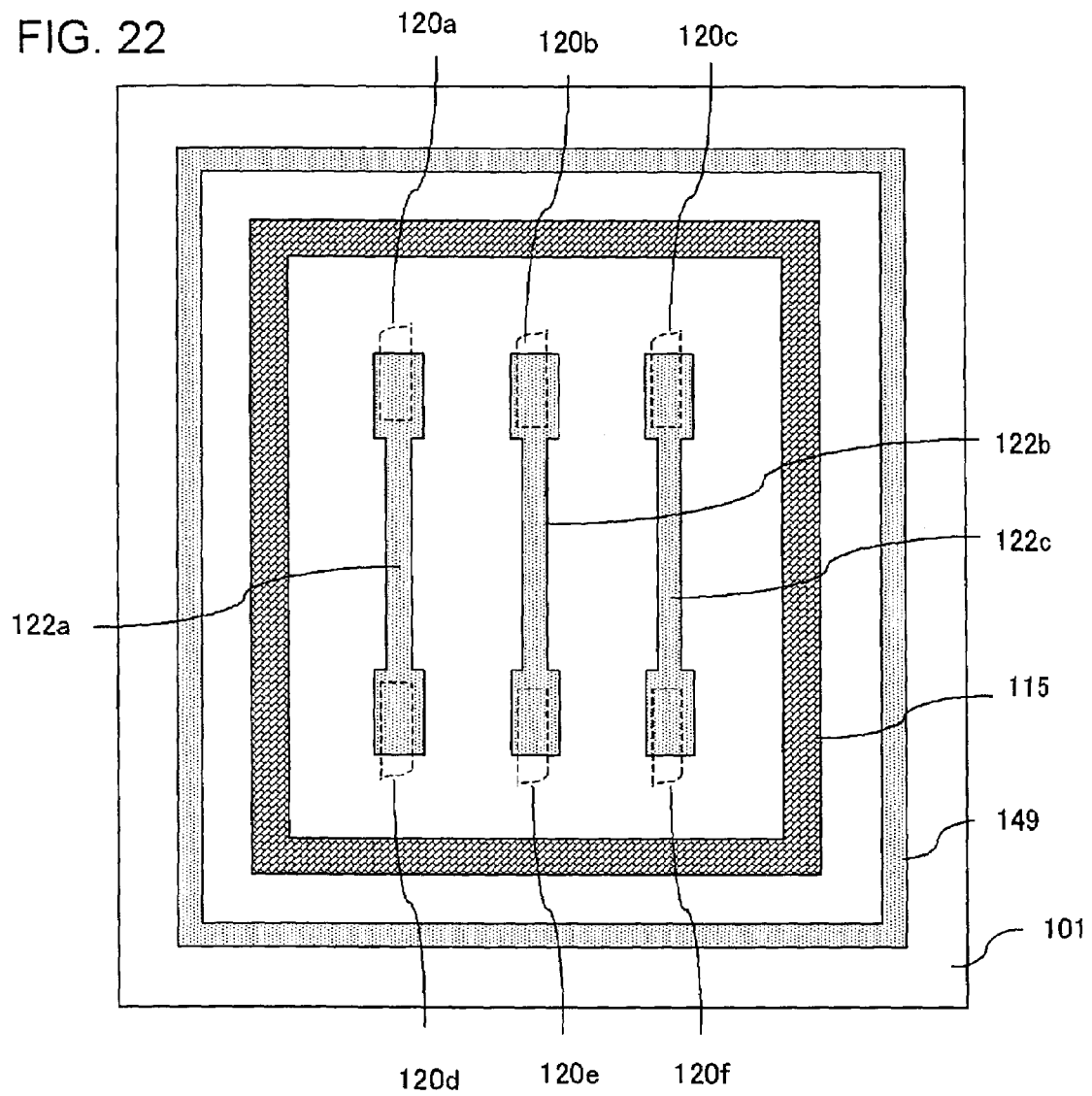
FIG. 22 is a schematic plan view showing a configuration of a semiconductor device according to an embodiment of the present invention.

FIG. 22 is a schematic plan view showing a semiconductor device including a seal ring according to a present embodiment. The semiconductor device according to this embodiment includes a fuse 122a, a fuse 122b, and a fuse 122c constituted of films of a high-melting point metal such as Ta or TaN.

The fuse 122a, fuse 122b, and fuse 122c are provided for having a central fine wire portion thereof melted by a laser irradiation, so that interconnects connected to the respective end portions of the fuse become disconnected. Accordingly, the fuses 122a, 122b and 122c are made of a highly conductive, high-melting point metal which efficiently absorbs the laser.

The fine wire included in a central portion, that is, the laser irradiated region of the fuses 122a, 122b and 122c is as fine as 0.5 μm to 1.6 μm in diameter, for example. The end portions of the fuses 122a, 122b and 122c are thicker than the portion in the laser irradiated region, and respectively connected to a copper interconnect 120a, a copper interconnect 120b, a copper interconnect 120c, a copper interconnect 120d, a copper interconnect 120e, and a copper interconnect 120f included in the insulating interlayer located right under the end portions.

Also, the insulating interlayer located under the fuses 122a, 122b and 122c includes a seal ring 149 disposed so as to surround a region right under the fuses 122a, 122b and 122c. And between the seal ring 149 and the fuses 122a, 122b and 122c, the interface reinforcing film 115 is located. Here, the interface reinforcing film 115 may have a structure as shown in FIG. 1, for example.

Such configuration allows suppressing propagation of a crack toward a peripheral region of the silicon substrate 101 beyond the interface reinforcing film 115.

Although the present invention has been described in details based on the preferred embodiments, it is to be understood that the embodiments are only exemplary, and that it is apparent to those skilled in the art that various modifications may be made without departing from the scope of the present invention.

For example, in the foregoing embodiments, the film density of the insulating films may be obtained by observation of a cross-section of the semiconductor device through a TEM (Transmission Electron Microscope).

It is apparent that the present invention is not limited to the above embodiments, that may be modified and changed without departing from the scope and spirit of the invention.

What is claimed is:

1. A semiconductor device comprising:
a semiconductor substrate that includes a region in which an element is provided and a peripheral region surrounding a periphery of said region in which said element is provided;
a first metal interconnect formed in a first metal layer;
a second metal interconnect formed in a second metal layer;
a plug connecting said first metal interconnect and said second metal interconnect, the plug being formed in a plug layer including a first insulating film and a second insulating film having a lower film density than said first insulating film;
a concave portion penetrating said first insulating film and said second insulating film; and
an interface reinforcing film including silicon and oxygen formed in said concave portion, said interface reinforcing film being disposed in said peripheral region.

2. The semiconductor device according to claim 1, wherein said second insulating film is constituted of a low dielectric constant film.

3. The semiconductor device according to claim 1, wherein said first insulating film is constituted of one of a SiC film, a SiCN film, a SiN film or a SiON film, and said second insulating film is constituted of one selected from the group consisting of a SiOC film, a hydrogen polysiloxane film, a methyl polysiloxane film, and a methyl hydrogen polysiloxane film.

4. The semiconductor device according to claim 1, wherein said semiconductor substrate includes a first region in which an element is provided and a second region, and said interface reinforcing film is disposed along a boundary between said first region and said second region.

5. The semiconductor device according to claim 1, further comprising a guard ring located in said peripheral region so as to surround said region in which said element is provided;
wherein said interface reinforcing film is disposed so as to surround an outer periphery of said guard ring.

6. The semiconductor device according to claim 1, wherein said interface reinforcing film is formed in a stripe pattern.

7. The semiconductor device according to claim 1, wherein said interface reinforcing film is located close to a dicing section of the semiconductor substrate.

8. The semiconductor device according to claim 1, wherein said concave portion has a depth greater than a width thereof, thereby securing room for disposing said air gap.

9. The semiconductor device according to claim 1, wherein said interface reinforcing film inhibits crack propagation.

10. The semiconductor device according to claim 1, wherein said concave portion is penetrating said first insulating film, said second insulating film and said first metal layer.

11. The semiconductor device according to claim 1, wherein said concave portion is partially buried by said interface reinforcing film so as to have an air gap.

12. The semiconductor device according to claim 11, wherein said interface reinforcing film and air gap inhibits crack propagation.

13. The semiconductor device according to claim 1, wherein said concave portion is fully buried by said interface reinforcing film.

14. The semiconductor device according to claim 1, wherein said interface reinforcing film is an SiOC film.

15. The semiconductor device according to claim 1, wherein said concave portion is spaced apart from said plug.

16. A semiconductor device comprising:
a semiconductor substrate that includes a region in which an element is provided and a peripheral region surrounding a periphery of said region in which said element is provided;
a first metal interconnect formed in a first metal layer;
a second metal interconnect formed in a second metal layer;
a plug connecting said first metal interconnect and said second metal interconnect, the plug being formed in a plug layer including a first insulating film and a second insulating film having a lower film density than said first insulating film;
a concave portion penetrating said first insulating film and said second insulating film;
an interface reinforcing film including silicon and oxygen formed in said concave portion, said interface reinforcing film being disposed in said peripheral region; and
a guard ring located in said peripheral region so as to surround said region in which said element is provided,
wherein said interface reinforcing film is disposed so as to surround an outer periphery of said guard ring.

* * * * *